United States Patent
Yuzurihara et al.

(10) Patent No.: US 9,137,885 B2
(45) Date of Patent: Sep. 15, 2015

(54) DC POWER SUPPLY DEVICE, AND CONTROL METHOD FOR DC POWER SUPPLY DEVICE

(75) Inventors: Itsuo Yuzurihara, Yokohama (JP); Toshiyuki Adachi, Yokohama (JP); Shinichi Kodama, Yokohama (JP)

(73) Assignee: KYOSAN ELECTRIC MFG CO., LTD., Yokohama-shi (JP)

( * ) Notice: Subject to any disclaimer, the term of this patent is extended or adjusted under 35 U.S.C. 154(b) by 0 days.

(21) Appl. No.: 14/414,816

(22) PCT Filed: Sep. 7, 2012

(86) PCT No.: PCT/JP2012/072854
§ 371 (c)(1),
(2), (4) Date: Jan. 14, 2015

(87) PCT Pub. No.: WO2014/038060
PCT Pub. Date: Mar. 13, 2014

(65) Prior Publication Data
US 2015/0195896 A1 Jul. 9, 2015

(51) Int. Cl.
H05B 31/26 (2006.01)
H05H 1/46 (2006.01)
H02M 3/335 (2006.01)
H05H 7/00 (2006.01)

(52) U.S. Cl.
CPC ............. H05H 1/46 (2013.01); H02M 3/33507 (2013.01); H05H 7/001 (2013.01)

(58) Field of Classification Search
USPC .................... 315/111.21, 111.01; 313/231.31, 313/231.61, 231.71; 363/15–27, 21.02, 363/21.03, 124, 127, 132, 133
See application file for complete search history.

(56) References Cited

U.S. PATENT DOCUMENTS

| | | | |
|---|---|---|---|
| 7,304,436 B2 * | 12/2007 | Cho | 315/167 |
| 2008/0143260 A1 * | 6/2008 | Tuymer et al. | 315/111.21 |

(Continued)

FOREIGN PATENT DOCUMENTS

| JP | 11-229138 A | 8/1999 |
|---|---|---|
| JP | 2002-173772 A | 6/2002 |

(Continued)

OTHER PUBLICATIONS

International Search Report dated Dec. 4, 2012 issued in corresponding application No. PCT/JP2012/072854.

(Continued)

*Primary Examiner* — Douglas W Owens
*Assistant Examiner* — James H Cho
(74) *Attorney, Agent, or Firm* — Westerman, Hattori, Daniels & Adrian, LLP

(57) ABSTRACT

Intermittent short-circuit control is performed in the ignition mode, thereby allowing short-circuit current to flow in the current source step-down type chopper. Energy of the short-circuit current is temporarily accumulated in the inductor provided in the current source step-down type chopper. The accumulated energy boosts the output voltage from the direct current power supply device during the period until the next short circuiting, via the current, the multiphase inverter, and the rectifier. The voltage boosting operation where accumulation of the current energy by short circuiting and boosting of the output voltage by conduction are repeated, controls an increase of the output voltage which is applied to the plasma generator.

20 Claims, 12 Drawing Sheets

(56) References Cited

U.S. PATENT DOCUMENTS

2011/0043771 A1* 2/2011 Hirao .............................. 353/85
2013/0038216 A1* 2/2013 Hao ............................... 315/132

FOREIGN PATENT DOCUMENTS

| JP | 2005-94827 A | 4/2005 |
| JP | 2010-225308 A | 10/2010 |
| JP | 2010-255061 A | 11/2010 |
| TW | 201031276 A1 | 8/2010 |
| TW | 201032676 A1 | 9/2010 |
| TW | 201230644 A1 | 7/2012 |
| WO | 2010/098779 A1 | 9/2010 |

OTHER PUBLICATIONS

Written Opinion of the International Searching Authority dated Dec. 4, 2012 issued in corresponding application No. PCT/JP2012/072854.

Communication of Allowance dated Mar. 27, 2015, issued in corresponding Taiwanese Patent Application No. 102116690, with Partial english translation (5 pages).

Notification of Transmittal of Translation of the International Preliminary Report on Patentability (Form PCT/IB/236) of International Application No. PCT/JP2012/072854 with Forms PCT/IB/373, PCT/IB/338 and PCT/ISA/237 (11 pages), Dec. 4, 2012.

* cited by examiner

FIG. 8

| | IGNITION MODE | | SWITCHING OPERATION | STEADY OPERATION MODE |
|---|---|---|---|---|
| | IG VOLTAGE RISE SECTION | IG VOLTAGE CONSTANT SECTION | | |
| CHOPPER CONTROL | SWITCHING ELEMENT $Q_1$: PULSE WIDTH CONTROL INTERMITTENT SHORT-CIRCUIT CONTROL VOLTAGE BOOSTING CONTROL UP TO IGNITION SET VOLTAGE $V_{IGR}$ | SWITCHING ELEMENT $Q_1$: PULSE WIDTH CONTROL CONSTANT VOLTAGE CONTROL AT IGNITION SET VOLTAGE $V_{IGR}$ | CHANGE SETTINGS $V_{IGR} \rightarrow V_R$ | SWITCHING ELEMENT $Q_1$: PULSE WIDTH CONTROL CONSTANT VOLTAGE CONTROL AT STEADY OPERATION SET VOLTAGE $V_R$ |
| INVERTER CONTROL | SWITCHING ELEMENTS $Q_R$, $Q_S$, $Q_T$, $Q_X$, $Q_Y$, $Q_Z$: PULSE WIDTH CONTROL | | | SWITCHING ELEMENTS $Q_R$, $Q_S$, $Q_T$, $Q_X$, $Q_Y$, $Q_Z$: PULSE WIDTH CONTROL |
| OUTPUT CURRENT | SET CURRENT: IGNITION SET CURRENT $I_{IGR}$ OUTPUT CURRENT: $0 \rightarrow$ IGNITION SET CURRENT $I_{IGR}$ | | | OUTPUT CURRENT $I_O$ |
| OUTPUT VOLTAGE | SET VOLTAGE: IGNITION SET VOLTAGE $V_{IGR}$ OUTPUT VOLTAGE $V_O$: $0 \rightarrow V_{IGR}$ | SET VOLTAGE: IGNITION SET VOLTAGE $V_{IGR}$ OUTPUT VOLTAGE $V_O$: MAINTAINED AT $V_{IGR}$ | $V_{IGR} \rightarrow V_R$ | SET VOLTAGE: STEADY OPERATION CONSTANT VOLTAGE $V_R$ OUTPUT VOLTAGE $V_O$: MAINTAINED AT $V_R$ |

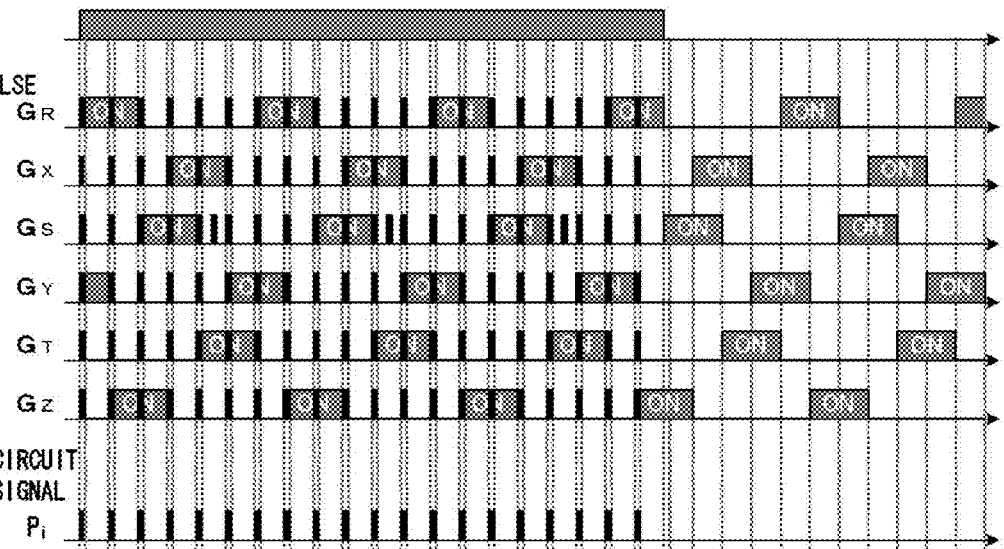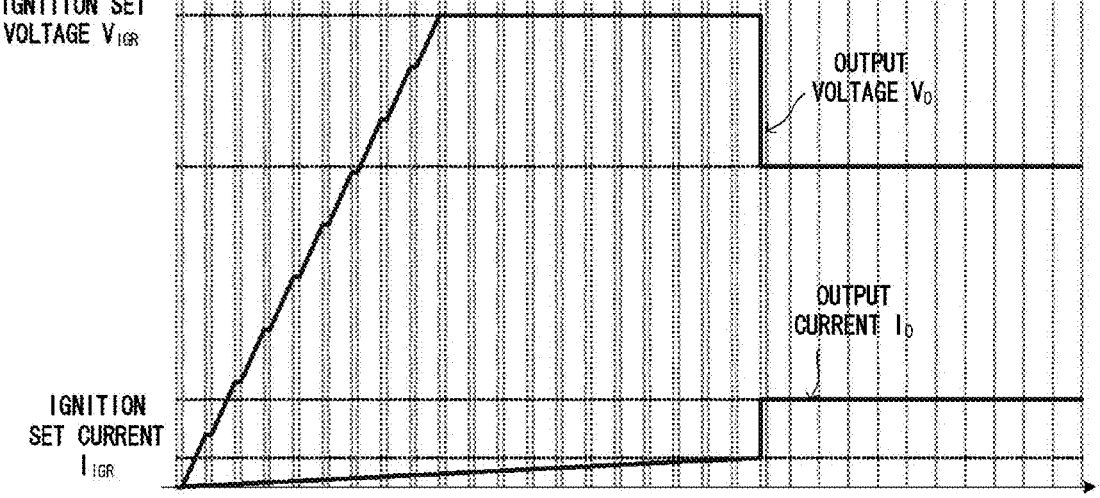
FIG. 9A
IG GENERATION SIGNAL
FIG. 9B
GATE PULSE SIGNAL $G_R$
$G_X$
$G_S$
$G_Y$
$G_T$
$G_Z$
FIG. 9C
SHORT-CIRCUIT PULSE SIGNAL $P_i$
FIG. 9D
IGNITION SET VOLTAGE $V_{IGR}$
OUTPUT VOLTAGE $V_0$
OUTPUT CURRENT $I_0$
IGNITION SET CURRENT $I_{IGR}$

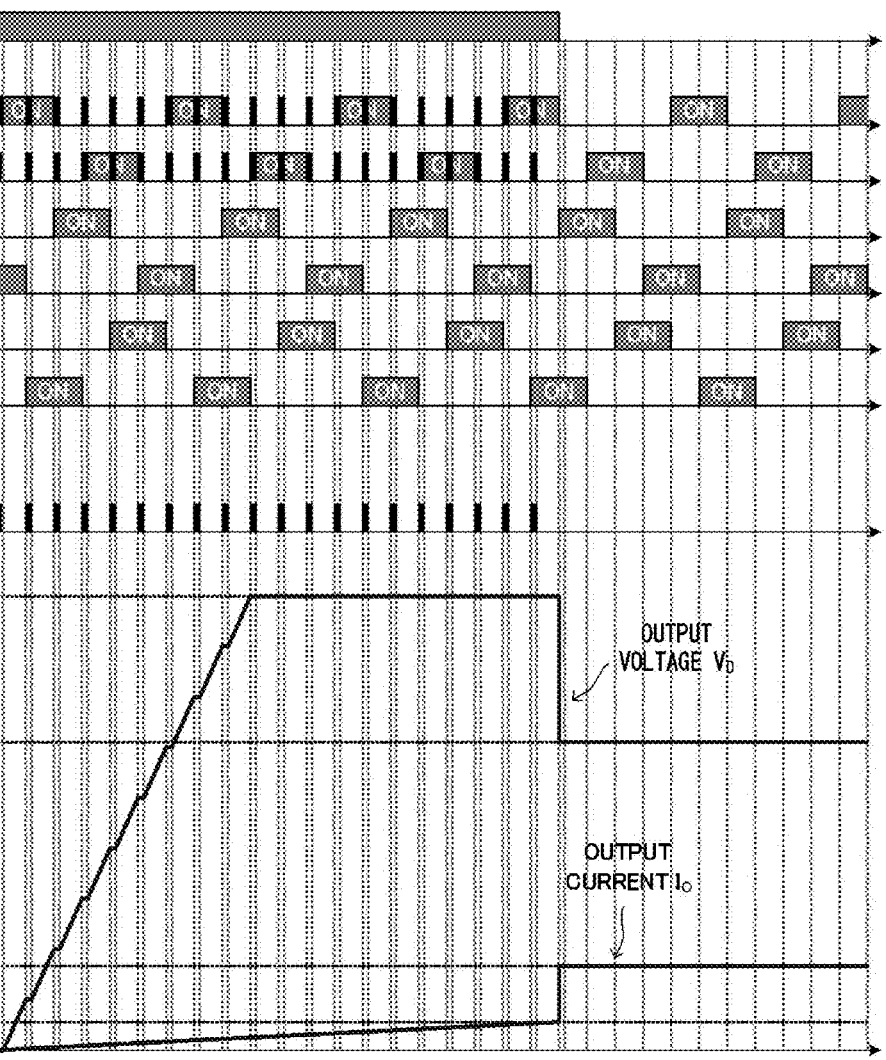

DC POWER SUPPLY DEVICE, AND CONTROL METHOD FOR DC POWER SUPPLY DEVICE

TECHNICAL FIELD

The present invention relates to a direct current power supply device, and for example, it relates to a direct current power supply device used for a load such as a plasma generator, and the like, and a method for controlling the direct current power supply device.

BACKGROUND ART

There is known a plasma treatment process which applies plasma to a processing target such as a substrate, in manufacturing a semiconductor device, a liquid crystal panel, a disk, or the like, or in a sputtering process and the like. In this plasma treatment process, a direct current power supply device supplies a plasma generator with direct current (DC) power, thereby allowing processed gas to be plasmatized, or the like, in the space within the plasma generator so as to generate plasma, and using thus generated plasma, a film forming process or an etching process is performed on a substrate surface.

Typically, the plasma generator corresponds to an electrical load when viewed from the direct current power supply device, and the load at a starting point for generating plasma discharge before the plasma discharge is actually generated, is different from the load during a normal operation when the plasma discharge is generated stably. Therefore, usually, upon starting the plasma discharge generation, the direct current power supply device applies ignition voltage which is higher than the voltage for the normal operation, for a certain period of time, and thereafter applies low discharge voltage during the period of the normal operation (Patent Document 1). In addition, it is known that starting of the plasma discharge is detected by incoming current (Patent Documents 2 and 3).

As a circuit for generating the ignition voltage for the occurrence of plasma discharge, there is known a circuit using a resonant converter or a circuit using chopper control.

FIG. 12A and FIG. 12B each illustrates an ignition voltage generation circuit using the resonant converter; FIG. 12A illustrates a circuit example of a series resonant converter, and FIG. 12B illustrates a circuit example of a parallel resonant converter. In the circuit example as shown in FIG. 12A, the series resonant circuit LC is connected between an inverter circuit and a converter made up of a diode rectifier circuit, and in the circuit example as shown in FIG. 12B, the parallel resonant circuit LC is connected between the inverter circuit and the converter made up of the diode rectifier circuit. The ignition voltage generation circuit using the resonant converter boosts the ignition voltage by resonance.

FIG. 12C is a circuit example of the chopper control, and a chopper circuit is provided between a DC source (Ein) and the inverter circuit. In the circuit for the chopper control, the ignition voltage is controlled by an ON duty ratio of a switching element provided in the chopper circuit.

PRIOR ART DOCUMENT

Patent Document

Patent Document 1
Japanese Unexamined Patent Application Publication No. 2010-255061 (Paragraph [0006])
Patent Document 2
Japanese Unexamined Patent Application Publication No. 11-229138 (Paragraph [0009])
Patent Document 3
Japanese Unexamined Patent Application Publication No. 2002-173772 (Paragraph [0032])

DISCLOSURE OF THE INVENTION

Problem to be Solved by the Invention

In the device as described in the Patent Document 2, plasma is generated by applying voltage higher than preset discharge voltage for a certain period of time. In the device as described in the Patent Document 3, the plasma discharge is ignited by instantaneously applying voltage at a rated value or higher.

As described above, the voltage for igniting the plasma is higher than the discharge voltage or the rated voltage, and it is applied for a certain period or instantaneously. Since there is variability in occurrence of plasma discharge, it is necessary to set the application time to be longer if the applied voltage is low.

In order to generate the plasma discharge reliably within a short application time, it is necessary to generate voltage higher than the discharge voltage and the rated voltage. Therefore, there is a problem that the direct current power supply device for supplying DC power to the plasma generator may end up as an intricate and oversized device so as to increase the voltage used for generating the plasma discharge.

In the case where the plasma discharge is made to arise using low application voltage, the application time becomes longer. Therefore, there is a problem that the processing time in the plasma generator becomes longer.

On the other hand, in the ignition voltage generation circuit, if the series resonant converter and the parallel resonant converter are employed, the voltage is boosted according to resonance operation. Therefore, there is a problem that a maximum value of the boosted ignition voltage is only twice as high as the input DC voltage Edc. In order to raise the ignition voltage, it is necessary to raise the input DC voltage Edc, and therefore, preparation of high-voltage DC source is required.

In the ignition voltage generation circuit, if the chopper control is performed, the inverter circuit is not provided with any resonance circuit. Therefore, there is a problem that in the step-down chopper circuit, an obtainable maximum value of the ignition voltage is only up to the input DC voltage Ein.

Therefore, also in the ignition voltage generation circuit according to the resonant circuit or the chopper circuit, there is a problem that the direct current power supply device may end up as an intricate and oversized device so as to increase the voltage used for generating the plasma discharge.

An object of the present invention is to solve the aforementioned conventional problems, and it is directed to simplification and down-sizing of a device structure of the direct current power supply device for supplying DC power to the plasma generator, in order to form high voltage which allows generation of plasma discharge.

Another object is to reduce a time length for applying voltage which is required to generate the plasma discharge, without using a direct current power supply device having an oversized and intricate configuration.

Means to Solve the Problem

When DC power is supplied to a load such as a plasma generator to perform plasma processing, there is a step to be carried out for generating plasma discharge in the plasma generator, upon power activation or upon restarting. On this occasion, the direct current power supply device applies voltage called as ignition voltage to the plasma generator, the ignition voltage being higher than the voltage applied for a normal operation, thereby generating the plasma discharge.

The present invention relates to a direct current power supply device for generating voltage to be applied to the plasma generator so as to generate plasma discharge, and a method for controlling the direct current power supply device.

It is necessary to boost the voltage to be applied to the plasma generator, up to the ignition set voltage which is required to generate the plasma discharge. The direct current power supply device of the present invention repeats multiple times, a step for allowing current to flow only for an extremely short space of time in a current source step-down type chopper provided in the direct current power supply device, thereby raising output voltage gradually by using energy of current, and boosting the voltage up to the ignition set voltage.

In the direct current power supply device of the present invention, in order to allow the current to flow only for an extremely short space of time in the current source step-down type chopper, a current path from the current source step-down type chopper to an output terminal of the direct current power supply device is interrupted for the moment, thereby allowing short-circuit current to flow in the current source step-down type chopper. Since the current path to the output terminal of the direct current power supply device is interrupted, the current in the current source step-down type chopper is temporarily accumulated in an inductor provided in the current source step-down type chopper.

Thereafter, when the interruption of the current path to the output terminal of the direct current power supply device is canceled and the current path from the current source step-down type chopper to the output terminal of the direct current power supply device is formed, energy accumulated in the inductor boosts the voltage at the output terminal of the direct current power supply device. By repeating the voltage boosting at the output terminal according to the current accumulation and canceling thereof, the voltage at the output terminal of the direct current power supply device is boosted up to the ignition set voltage.

FIG. 1 illustrates operations of the present invention; an operation for generating short-circuit current and an operation for boosting the output voltage according to the short-circuit current.

FIG. 1A illustrates the operation for generating the short-circuit current. In the current source step-down type chopper or in a multiphase inverter, a short circuit is established between the positive voltage side and the negative voltage side, thereby allowing the short-circuit current $\Delta i$ to flow in the current source step-down type chopper. Energy of the short-circuit current $\Delta i$ is accumulated in the inductance L.

FIG. 1B illustrates an operation for boosting the output voltage. When the short-circuit operation is suspended and the state between the current source step-down type chopper and the multiphase inverter is switched to a connecting state, the energy accumulated in the inductance L is converted into voltage, thereby boosting the output voltage. In FIG. 1B, the voltage of the output capacitance $C_o$ is boosted. It is to be noted that if the load side is provided with capacitance, a parallel circuit connecting the output capacitance $C_o$ and the load side capacitance boosts the output voltage.

According to the direct current power supply device of the present invention, switching elements in a bridge circuit of the multiphase inverter, connected to the current source step-down type chopper are controlled, thereby establishing a short circuit between the positive voltage side and the negative voltage side. Alternatively, a switching element is connected between the positive voltage side and the negative voltage side at the output terminal of the current source step-down type chopper, and this switching element is controlled to establish a short-circuit between the positive voltage side and the negative voltage side.

In the direct current power supply device of the present invention, the current flowing in the current source step-down type chopper according to each short circuit is accumulated in the inductance L, and the accumulated current is converted into energy to boost the output voltage. Since a degree of voltage boosting by one short circuit is small, the step of voltage boosting according to the short circuit is repeated multiple times, thereby boosting the output voltage gradually up to the ignition set voltage. It is possible to increase the amount of voltage boosting per short-circuit, by extending the time period while the positive voltage side and the negative voltage side are short-circuited. On this occasion, the smaller is the voltage boosting amount for one time, a degree of voltage boosting is controllable in the smaller increments, thereby enhancing resolution performance of the voltage boosting, and it is advantageous in controlling the output voltage.

Simple short-circuiting between the positive voltage side and the negative voltage side in a circuit of the current source step-down type chopper or in a circuit of the multiphase inverter connected to this chopper circuit, allows a current path to be formed for an extremely short space of time in the current source step-down type chopper, and therefore, it is possible to achieve a simple and small-sized configuration of the direct current power supply device.

[Direct Current Power Supply Device]

A direct current power supply device of the present invention for supplying DC power to a plasma generator is provided with a current source step-down type chopper for constituting a DC source, a multiphase inverter for converting DC output from the current source step-down type chopper into multi-phased AC power according to operations of multiple switching elements, a rectifier for subjecting the output from the multiphase inverter to AC-DC conversion, and supplying thus obtained DC to a load, and a controller provided with a chopper controller for controlling the current source step-down type chopper and an inverter controller for controlling the multiphase inverter.

The controller is provided with two types of control; a switching control for switching an operation mode, and an intermittent short-circuit control for forming a current path in a circuit of the current source step-down type chopper only for an extremely short space of time.

The switching control switches between an ignition mode for supplying ignition voltage which generates plasma discharge in the plasma generator, and a steady operation mode for supplying steady operation current to continue the plasma discharge in the plasma generator.

In the intermittent short-circuit control, a short circuit is established intermittently between the positive voltage side and the negative voltage side of the current source step-down type chopper and/or the multiphase inverter, and this short circuit forms a current path only for an extremely short space of time in the current source step-down type chopper circuit, thereby allowing the short-circuit current to flow therein.

The controller performs the intermittent short-circuit control in the ignition mode, thereby allowing the short-circuit current to flow in the current source step-down type chopper.

Energy of this short-circuit current is temporarily accumulated in the inductor which is provided in the current source step-down type chopper. The energy thus accumulated boosts the output voltage in the direct current power supply device, via the multiphase inverter and the rectifier, during the time period until the next short circuit. This accumulation of current energy due to the short circuit and the voltage boosting operation which repeats boosting of the output voltage according to conduction, perform control to raise the output voltage which is applied to the plasma generator.

In the ignition mode, the chopper controller performs pulse width control to control input voltage in the current source step-down type chopper to be a predetermined voltage.

In the ignition mode, the output voltage from the direct current power supply device is determined by the voltage boosting according to multiple times of the short-circuit operation and the input voltage in the current source step-down type chopper, being determined by the chopper control. In addition, the number of short circuiting times, being required to boost the voltage up to the ignition set voltage, is able to be determined based on the configuration of the direct current power supply device and a usage condition thereof, since there is relevance to the input voltage of the current source step-down type chopper, duration of the ignition mode, a voltage range boosted by one time short-circuit operation, and the like.

The controller of the present invention uses as parameters, for instance, an ON duty ratio of the chopper control by the chopper controller and the number of the intermittent short-circuit control times. The input voltage of the current source step-down type chopper is controlled by the ON duty ratio, and a voltage boosting ratio is controlled by the number of the intermittent short-circuit control times, and further the input voltage and the voltage boosting ratio of the current source step-down type chopper control a voltage rise of the output voltage.

Either the inverter controller or the chopper controller is able to perform the intermittent short-circuit control of the present invention. There are various configurations for the intermittent short-circuit control according to the inverter controller.

(First Configuration of the Intermittent Short-Circuit Control According to the Inverter Controller)

The first configuration of the intermittent short-circuit control according to inverter controller of the present invention, generates a gate pulse signal for performing pulse width control on the switching elements in the bridge circuit constituting the multiphase inverter, simultaneously generates a short-circuit pulse signal for establishing a short-circuit intermittently between the positive voltage side and the negative voltage side of the bridge circuit, then generates a control signal by superimposing thus generated gate pulse signal on the short-circuit pulse signal, and controls the multiphase inverter by thus generated control signal.

The gate pulse signal within the control signal performs pulse width control on each switching element in the bridge circuit of the multiphase inverter, thereby converting DC to AC.

On the other hand, the short-circuit pulse signal within the control signal turns a pair of the switching elements to ON state simultaneously, the pair being counterparts of each other serially connected between the terminals on the positive voltage side and on the negative voltage side of the bridge circuit, thereby establishing a short circuit between the terminals on the positive voltage side and on the negative voltage side of the bridge circuit.

(Second Configuration of the Intermittent Short-Circuit Control According to the Inverter Controller)

The second configuration of the intermittent short-circuit control according to the inverter controller of the present invention, generates a gate pulse signal for performing the pulse width control on the switching elements in the bridge circuit constituting the multiphase inverter, simultaneously generates a pulse signal as a short-circuit pulse signal, for starting ON operation of a switching element being the counterpart of the switching element as to which the ON operation is started by the gate pulse signal, among the pairs of switching elements being counterparts of each other serially connected between the terminals on the positive voltage side and on the negative voltage side of the bridge circuit, at any timing within the duration of the gate pulse signal which turns each switching element to ON state, generates a control signal by superimposing thus generated gate pulse signal on the short-circuit pulse signal, and controls the multiphase inverter by thus generated control signal.

The gate pulse signal within the control signal performs pulse width control on each switching element in the bridge circuit of the multiphase inverter, and converts DC to AC. On the other hand, the short-circuit pulse signal within the control signal establishes a short circuit between the positive voltage side and the negative voltage side of the bridge circuit, according to the switching element which is turned to ON state by the gate pulse signal, and the switching element which is turned to ON state by the short-circuit pulse signal.

(Third Configuration of the Intermittent Short-Circuit Control According to the Inverter Controller)

The third configuration of the intermittent short-circuit control according to the inverter controller of the present invention, generates a gate pulse signal for performing pulse width control on each switching element in the bridge circuit constituting the multiphase inverter and generates as a short-circuit pulse signal, a pulse signal for starting ON operation as to all the switching elements in the bridge circuit simultaneously, generates a control signal by superimposing thus generated gate pulse signal on the short-circuit pulse signal, and controls the multiphase inverter by thus generated control signal.

The gate pulse signal within the control signal performs pulse width control on each switching element in the bridge circuit of the multiphase inverter, and converts DC to AC. On the other hand, the short-circuit pulse signal within the control signal turns all the switching elements to ON state in the bridge circuit, thereby establishing a short circuit between the positive voltage side and the negative voltage side of the bridge circuit.

(Fourth Configuration of the Intermittent Short-Circuit Control According to the Inverter Controller)

The fourth configuration of the intermittent short-circuit control according to the inverter controller of the present invention generates a gate pulse signal for performing pulse width control on the switching elements in the bridge circuit constituting the multiphase inverter, simultaneously generates a pulse signal as a short-circuit pulse signal for starting ON operation as to at least one pair of switching elements among the pairs of switching elements serially connected between the terminals on the positive voltage side and on the negative voltage side of the bridge circuit, in the switching elements provided in the bridge circuit, generates a control signal by superimposing thus generated gate pulse signal on the short-circuit pulse signal, and controls the multiphase inverter by thus generated control signal.

The gate pulse signal within the control signal performs pulse width control on each switching element in the bridge circuit of the multiphase inverter, and converts DC to AC. On the other hand, the short-circuit pulse signal within the control signal turns the switching element to ON state, of at least one pair, among the pairs of the switching elements being counterparts of each other which serially connected between the terminals on the positive voltage side and on the negative voltage side in the bridge circuit, thereby establishing a short circuit between the positive voltage side and the negative voltage side.

In the first to the fourth configurations of the intermittent short-circuit control described above, during the short-circuit operation according to the short-circuit pulse signal, between the terminals on the positive voltage side and the negative voltage side of the bridge circuit, a flow of current from the current source step-down type chopper to the multiphase inverter is suspended. Therefore, the short-circuit current in the current source step-down type chopper flows without affected by the operation of DC-AC conversion according to the multiphase inverter.

The short-circuit operation forms a short-circuit current path in the current source step-down type chopper only for an extremely short space of time being a duration of the short-circuit pulse signal, allowing short-circuit current to flow. The energy of the short-circuit current is accumulated in the inductor within the current source step-down chopper circuit. The short-circuit operation is carried out as to each short-circuit pulse signal, for only a short period of time, and multiple short-circuit pulse signals are intermittently inputted, thereby performing multiple times of short-circuit operation.

In the intermittent short-circuit operation, from the end of one short-circuit operation until the next short-circuit operation, a conduction state is established between the current source step-down type chopper and the output terminal of the direct current power supply device. Accordingly, the energy accumulated in the inductor is transferred to the output terminal of the direct current power supply device, and boosts the output voltage. Energy conversion from the current to voltage is able to be carried out according to the electrode capacitance of the output capacitor on the output terminal side of the direct current power supply device or the plasma generator.

The current from the current source step-down type chopper to the output terminal side flows through the current path passing through each of the parts, i.e., the multiphase inverter, a transformer, and the rectifier, each constituting the direct current power supply device, and in addition, another current path directly connecting the current source step-down type chopper with the output terminal side is provided, for the flow of the current. In the configuration where the current is made to flow toward the output terminal side through the current path establishing direct connection, a switching means is provided for a conductive state in the ignition mode and for a non conductive state in the normal operation mode.

The short-circuit operation is performed based on each short-circuit pulse signal, and the short-circuit current is reset for each short-circuit operation. The output voltage is added to the voltage which was raised by the previous short-circuit operation, and the voltage is boosted incrementally.

(Intermittent Short-Circuit Control According to the Current Source Step-Down Type Chopper Controller)

The intermittent short-circuit control of the present invention is performed by the inverter controller as described above, but as another aspect, the current source step-down type chopper controller is able to perform this control.

In the aspect of the intermittent short-circuit control according to the chopper controller, there is provided a switching element for short circuiting which establishes a short circuit between the positive voltage side and the negative voltage side, the switching element being placed between the connection points of the current source step-down type chopper and the multiphase inverter.

The intermittent short-circuit control according to the step-down type chopper controller of the present invention, generates a short-circuit pulse signal for establishing a short circuit intermittently in the switching element for short circuiting. The short-circuit pulse signal turns the switching element for short circuiting to ON state, thereby establishing the short circuit between the positive voltage side and the negative voltage side of the output terminal of the current source step-down type chopper.

On the other hand, the inverter controller generates a gate pulse signal for performing pulse width control on the switching elements in the bridge circuit constituting the multiphase inverter. The gate pulse signal performs pulse width control on each switching element in the bridge circuit of the multiphase inverter, and converts DC to AC.

In the intermittent short-circuit control performed between the current source step-down type chopper and the multiphase inverter, a short-circuit occurs on the current source step-down type chopper side during the short-circuit operation between the positive voltage side and the negative voltage side. Therefore, a flow of current from the current source step-down type chopper to the multiphase inverter is suspended. Accordingly, the short-circuit current in the current source step-down type chopper is formed without being affected by the operation of DC-AC conversion of the multiphase inverter.

According to the short-circuit operation, a current path is formed in the current source step-down type chopper only for an extremely short space of time being the duration of the short-circuit pulse signal, and short-circuit current flows therethrough. Energy of the short-circuit current is accumulated in the inductor within the current source step-down type chopper. The energy of the short-circuit current being accumulated boosts the output voltage of the direct current power supply device until the next short-circuit operation.

Also in the intermittent short-circuit control according to the current source step-down type chopper controller, the current flows from the current source step-down type chopper to the output terminal side via a current path which passes through each parts i.e., the multiphase inverter, the transformer, and the rectifier, constituting the direct current power supply device. It is alternatively possible to allow the current to flow through the current path directly connecting the current source step-down type chopper with the output terminal side.

The short-circuit current is reset for each short-circuit operation, and the output voltage is added to the voltage which was raised by the previous short-circuit operation, and the voltage is boosted incrementally.

The controller of the present invention performs switching in the ignition mode, between the voltage boost control for raising the output voltage up to the ignition set voltage, by repeating the voltage boosting according to the short-circuit current for multiple number of times, and the constant voltage control for allowing the chopper control to maintain the output voltage at the ignition set voltage. The switching from the voltage boost control to the constant voltage control is carried out at the time when the output voltage reaches the ignition set voltage.

The voltage boost control raises the output voltage up to predetermined ignition set voltage, and after reaching the ignition set voltage, the constant voltage control maintains the ignition set voltage. With this configuration, voltage gradually increased is applied to the plasma generator in the stage of ignition mode, and after reaching the ignition set voltage, the ignition set voltage is applied until the end of the ignition mode.

It is possible to switch the ignition mode to the constant operation mode, based on the occurrence of plasma discharge in the plasma generator. In the constant operation mode, any of the following control is selectable; constant voltage control, constant current control, and constant power control.

The constant voltage control is an aspect of control where a set value of the steady operation is switched from the ignition set voltage that is set in the ignition mode, to steady operation set voltage, and the output voltage is maintained at the steady operation set voltage. The constant current control is an aspect of control where a set value of the steady operation is switched from the ignition set voltage set in the ignition mode, to steady operation set current, and the output current is maintained at the steady operation set current. The constant power control is an aspect of control where a set value of the steady operation is switched from the ignition set voltage set in the ignition mode, to steady operation set power, and the output power is maintained at the steady operation set power.

According to the constant voltage control in the ignition mode, when the output current reaches the ignition set current and the output voltage drops to plasma generation voltage, the ignition mode is switched to the steady operation mode, and any of the following control; constant voltage control, constant current control, constant power control is selected to be performed.

Switching from the ignition mode to the steady operation mode is performed based on the output current and the output voltage. Generally, occurrence of plasma discharge increases the output current, and drops the output voltage from the voltage at the ignition time. A level of the output voltage and a level of the output current are detected, from the direct current power supply device to the plasma generator, thereby detecting the occurrence of the plasma discharge, and switching from the ignition mode to the steady operation mode can be carried out.

[Method for Controlling the Direct Current Power Supply Device]

The direct current power supply device is provided with a current source step-down type chopper constituting a DC source, a multiphase inverter for converting DC output from the current source step-down type chopper into multiphase AC power according to operations of multiple switching elements, a rectifier for subjecting an output from the multiphase inverter to AC-DC conversion, and supplying thus obtained DC to a load, and a controller having a chopper controller for controlling the current source step-down type chopper and an inverter controller for controlling the multiphase inverter, and the direct current power supply device supplies DC power to a plasma generator.

A method for controlling the direct current power supply device according to the present invention includes following aspects of control; intermittent short-circuit control and switching control. According to the switching control, the ignition mode for supplying the ignition voltage for generating plasma discharge in the plasma generator is controlled to be switched to the steady operation mode for supplying steady operation current to maintain the plasma discharge in the plasma generator.

The intermittent short-circuit control is control under the ignition mode, establishes a short-circuit intermittently between the positive voltage side and the negative voltage side of the current source step-down type chopper or the multiphase inverter, and generates short-circuit current flowing in the current source step-down type chopper. In the ignition mode, boosting of the output voltage from the direct current power supply device is controlled by using the short-circuit current being generated, thereby generating the ignition voltage. This ignition voltage is applied to the plasma generator, thereby generating the plasma discharge.

According to the intermittent short-circuit control, the inverter controller controls the switching elements in the bridge circuit constituting the multiphase inverter so as to establish a short circuit between the positive voltage side and the negative voltage side of the bridge circuit, and this short circuit allows the short-circuit current to flow in the current source step-down type chopper which is connected to the multiphase inverter.

In the intermittent short-circuit control, the inverter controller generates a gate pulse signal for performing pulse width control on the switching elements in the bridge circuit constituting the multiphase inverter, and a short-circuit pulse signal for establishing a short circuit intermittently between the positive voltage side and the negative voltage side of the bridge circuit, superimposing the gate pulse signal on the short-circuit pulse signal, thereby generating a control signal. According to the control signal, the multiphase inverter is controlled, so that the short-circuit pulse signal turns a pair of the switching elements to ON state, the pair being counterparts of each other by serially connected between the terminals on the positive voltage side and on the negative voltage side of the bridge circuit, thereby establishing a short circuit between the positive voltage side and the negative voltage side of the bridge circuit.

The controller performs switching between voltage boost control for repeating the voltage boosting according to the short-circuit current for multiple number of times in the ignition mode, to raise the output voltage up to the ignition set voltage, and constant voltage control for maintaining the output voltage at the ignition set voltage by the chopper controller. Switching from the voltage boost control to the constant voltage control is performed after the output voltage is raised and reaches the ignition set voltage by the voltage boost control.

It is possible to control the output voltage $V_o$ by the input voltage in the current source step-down type chopper, and by a voltage boosting ratio according to the voltage boost control. Control of the input voltage in the current source step-down type chopper uses as a parameter the ON duty ratio of the chopper control by the chopper controller, and control of the voltage boosting ratio uses as the parameter, the number of the intermittent short-circuit control times.

The chopper controller controls the input voltage of the current source step-down type chopper by the ON duty ratio in the chopper control, controls the voltage boosting ratio by the number of the intermittent short-circuit control times, and controls the voltage rise of the output voltage by these input voltage and the voltage boosting ratio.

The chopper controller performs constant voltage control in the ignition mode, and in the steady operation mode, the chopper controller performs any of the following control; constant voltage control, constant current control, and constant power control. In the control selected from the constant voltage control, the constant current control, and the constant power control, control for maintaining a set value in each control is performed, the set value being any of the followings; a voltage set value, a current set value, and a power set value.

According to the constant voltage control in the ignition mode, control is performed to allow the output voltage $V_o$ to be the ignition set voltage, and chopper control is performed so that the input voltage of the current source step-down type chopper becomes predetermined voltage. On the other hand, in the control performed under the steady operation mode, after the plasma discharge occurs in the plasma generator, the output is controlled to become the set value (the voltage set value, the current set value, or the power set value) of the control selected in the steady operation mode, so as to maintain this plasma discharge.

Switching from the ignition set voltage to the set value being set in the steady operation mode is carried out based on the occurrence of the plasma discharge in the plasma generator. It is possible to know whether or not the plasma discharge has occurred in the plasma generator, by monitoring the output voltage and the output current.

When the plasma discharge occurs in the plasma generator, the output current supplied from the direct current power supply device to the plasma generator is switched from the ignition current to the steady operation current, at the time when the ignition mode is switched to the steady operation mode.

Since the ignition current increases step by step at every intermittent short-circuit operation, the ignition current becomes the maximum at the last stage when the ignition mode is switched to the steady operation mode. Here, the ignition current at the timing when the ignition mode is switched to the steady operation mode is obtained in advance, and it is determined as ignition set current. In addition, since when the plasma discharge occurs, the output voltage becomes a value lower than the ignition set voltage, the low voltage at the time of occurrence of the plasma discharge is determined as plasma generation voltage.

In detecting the occurrence of the plasma discharge, the output current is compared with the ignition set current, and the output voltage is compared with the plasma generation voltage, and the time when the output current reaches the ignition set current and the output voltage drops to the plasma generation voltage is determined as the time of the plasma discharge occurrence.

Upon detecting the plasma discharge occurrence, the set value of the control is switched from the ignition set voltage of the constant voltage control under the ignition mode, to the set value of any of the control under the steady operation mode, selected from the constant voltage control, the constant current control, and the constant power control, and then, the selected control is performed.

Under the steady operation mode, according to any of the control; the constant voltage control, the constant current control, or the constant power control, any of the constant voltage, constant current and constant power is applied to the plasma generator, thereby maintaining stable plasma discharge.

Effect of the Invention

As explained so far, according to the present invention, it is possible to simplify and downsize a device configuration which forms high voltage to generate plasma discharge, in the direct current power supply device for supplying DC power to the plasma generator.

In addition, it is possible to reduce voltage application time required for generating the plasma discharge, without using the direct current power supply device having an oversized and intricate configuration.

BRIEF DESCRIPTION OF DRAWINGS

FIG. 8 illustrates operating conditions of the ignition mode and the steady operation mode of the direct current power supply device, according to the present invention;

FIG. 9 is a timing chart for explaining the alternative configuration example 1 of the direct current power supply device;

FIG. 10 is a timing chart for explaining the alternative configuration example 2 of the direct current power supply device;

BEST MODE FOR CARRYING OUT THE INVENTION

Figure 2:
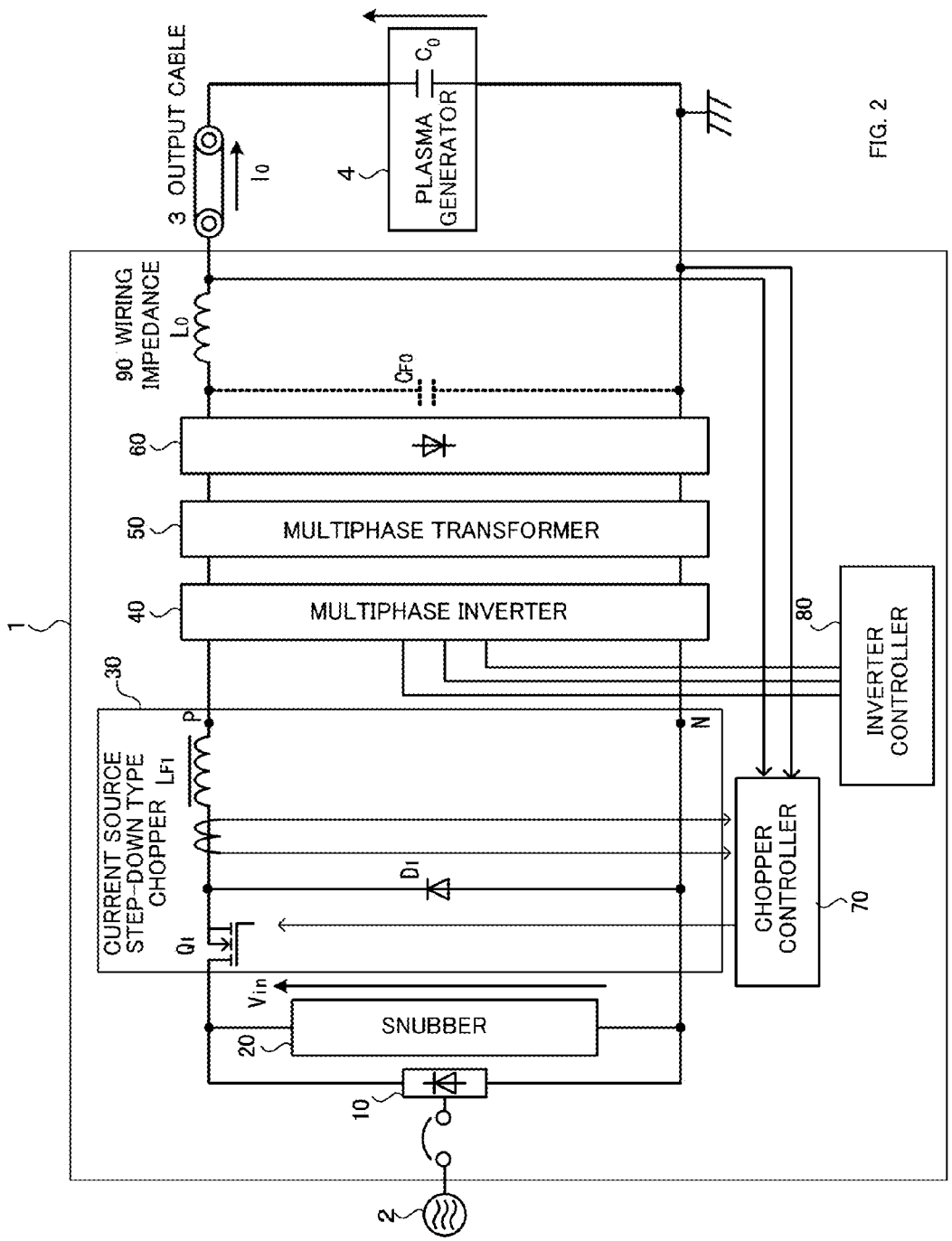
FIG. 2 illustrates an overall configuration of the direct current power supply device according to the present invention.
Figure 3:
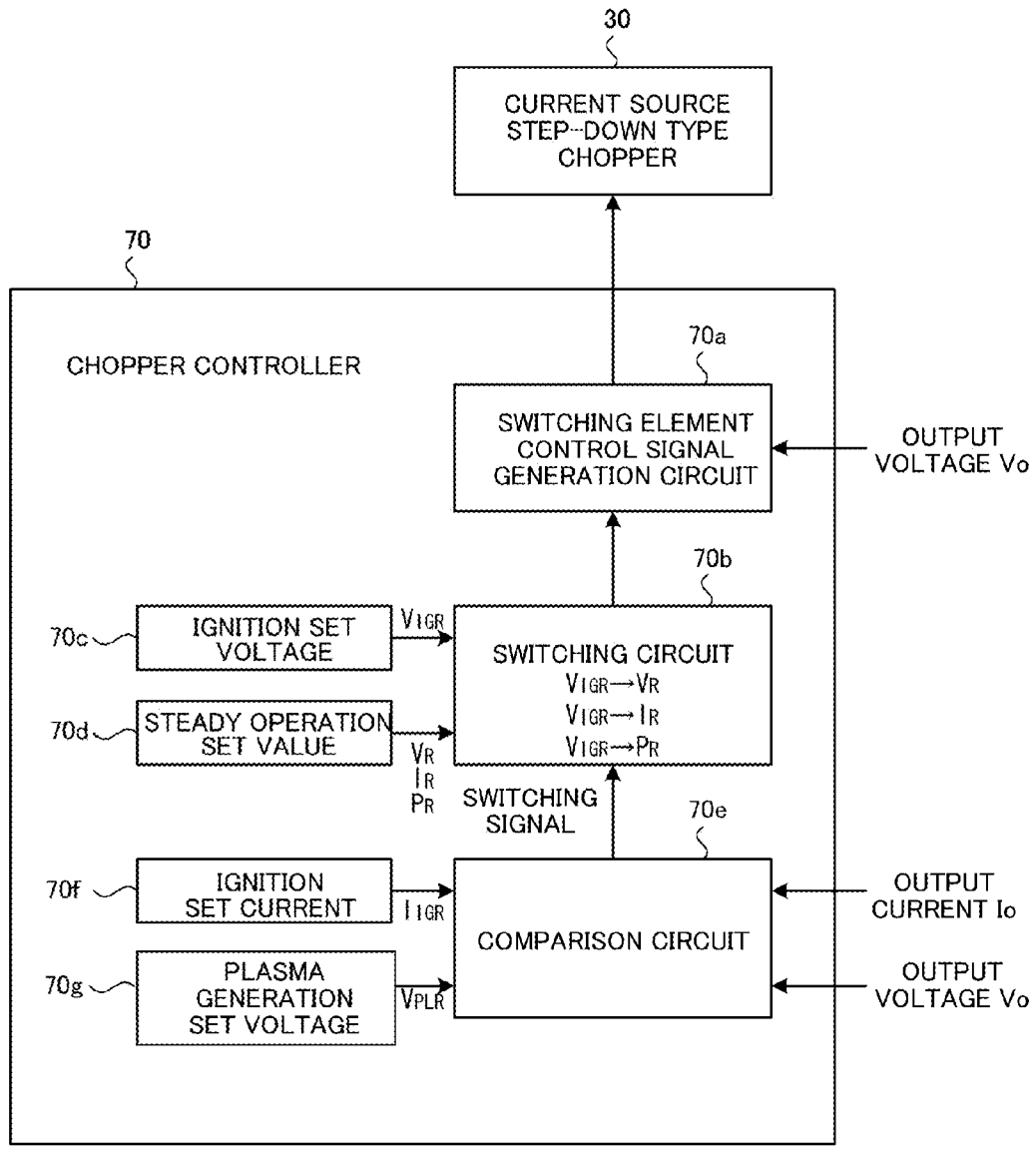
FIG. 3 illustrates a configuration example of a chopper controller provided in the direct current power supply device according to the present invention.
Figure 4:
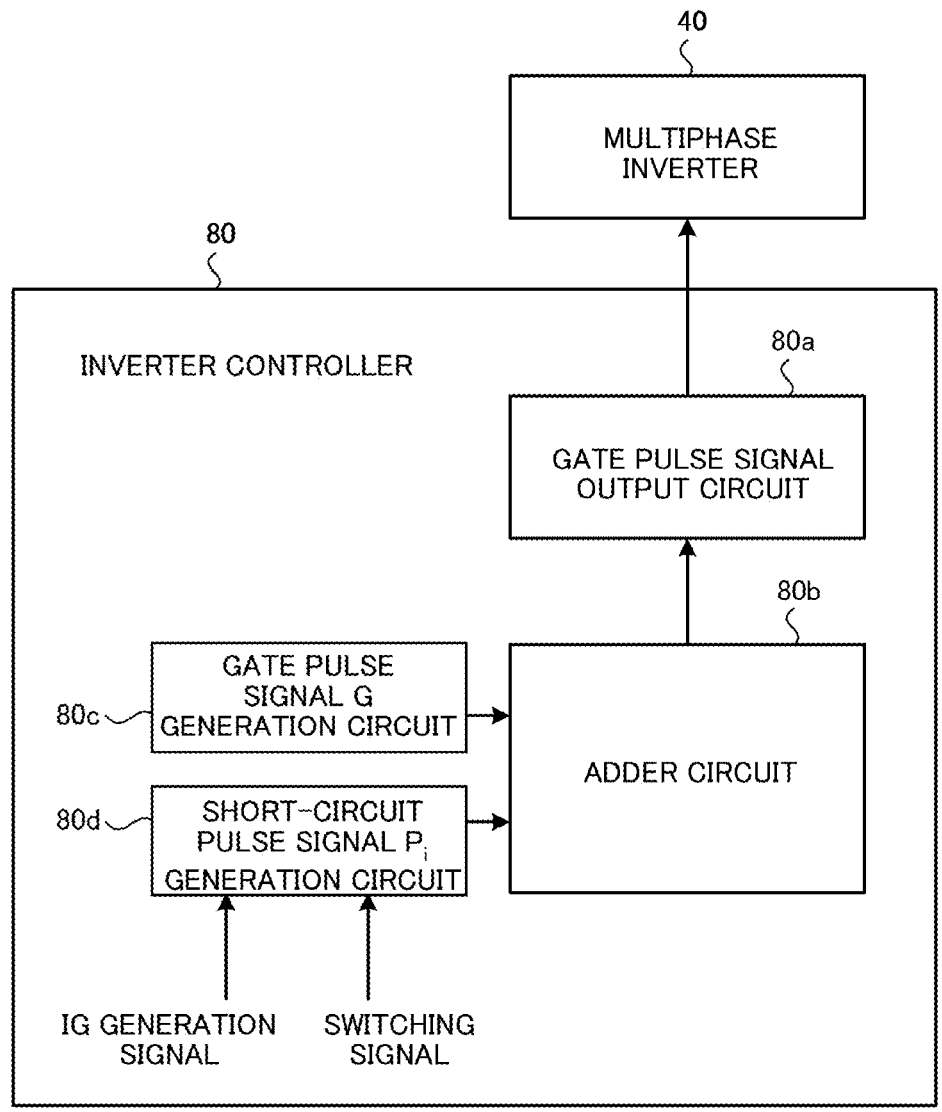
FIG. 4 illustrates a configuration example of the inverter controller provided in the direct current power supply device according to the present invention.

Hereinafter, embodiments of the present invention will be explained in detail with reference to the accompanying drawings. An explanation will be made in the following, as to a direct current power supply device and a control method thereof according to the present invention. With reference to FIG. 2 to FIG. 4, a configuration example of the direct current power supply device will be explained, and a control example of the direct current power supply device will be explained with reference to FIG. 5 to FIG. 8. In addition, with reference to FIG. 9 to FIG. 11, another configuration example of the direct current power supply device will be explained.

[Configuration Example of the Direct Current Power Supply Device]

Firstly, a configuration example of the direct current power supply device according to the present invention will be explained, with reference to FIG. 2 to FIG. 4. FIG. 2 illustrates an entire configuration of the direct current power supply device according to the present invention, FIG. 3 illustrates a configuration example of a chopper controller provided in the direct current power supply device according to the present invention, and FIG. 4 illustrates a configuration example of an inverter controller provided in the direct current power supply device according to the present invention.

The direct current power supply device 1 of the present invention as shown in FIG. 2, is provided with a rectifier 10 for rectifying AC power of an AC source 2, a snubber 20 constituting a protection circuit which suppresses high voltage being generated transiently, a current source step-down type chopper 30 for converting voltage of DC power inputted from the rectifier 10 into predetermined voltage and outputting DC power, a multiphase inverter 40 for converting the DC output from the current source step-down type chopper 30 into multiphase AC output, a multiphase transformer 50 for converting the AC output from the multiphase inverter 40 into predetermined voltage, and a multiphase rectifier 60 for converting the AC from the multiphase transformer 50 into DC.

The current source step-down type chopper 30 is provided with a switching element $Q_1$, a diode $D_1$, and a DC reactor $L_{F1}$. The switching element $Q_1$ performs chopper control on the DC voltage having been rectified by the rectifier 10, thereby accomplishing step-down of voltage. Voltage control by the current source step-down type chopper 30 is performed by controlling an ON duty ratio, being a ratio of ON and OFF of the switching element $Q_1$.

The DC reactor $L_{F1}$ performs smoothing on the direct current that has been subjected to chopper control. The direct current power supply device of the present invention allows short-circuit current to flow in the current source step-down type chopper 30 by the short-circuit operation, and temporarily accumulates this short-circuit current in the DC reactor $L_{F1}$. The accumulated energy in the DC reactor $L_{F1}$ boosts the output voltage during the time until the next short-circuit operation.

The multiphase inverter 40 inputs the direct current subjected to the current smoothing by the current source step-down type chopper 30, and performs DC-AC conversion by controlling the switching elements in the bridge circuit provided in the multiphase inverter 40.

The multiphase inverter 40 is provided with a multiphase inverter circuit which is made up of a bridge connection of switching elements, the number of which is associated with the number of phases. By way of example, in the case of three phases, the three-phase inverter circuit is provided with a bridge circuit made up of six switching elements. As the switching element, a semiconductor switching element such as IGBT and MOSFET may be employed, for instance. Each switching element of the multiphase inverter circuit performs switching operation based on a control signal from the switching controller 80, and converts DC power into AC power to output the AC power.

The AC output from the multiphase inverter 40 increases a switching frequency of the switching elements, thereby obtaining a high-frequency output. When the plasma generator is assumed as a load, the current source inverter supplies the load with the high-frequency output of 200 kHz, for instance. In order to output the high-frequency output, the multiphase inverter circuit performs switching operation of the switching elements at high frequency. When the switching elements are switched at high drive frequency, the AC output is allowed to contain a high-frequency ripple component.

The multiphase rectifier 60 rectifies the AC output from the multiphase inverter 40 and supplies DC output to the load. A conventionally known multiphase rectifier may have a configuration that it is provided with a DC filter circuit on the output part. This DC filter circuit removes the high-frequency ripple component included in the AC output from the multiphase inverter. The DC filter circuit may be made up of an output capacitor $C_{FO}$ connected in parallel to the output terminal, and an output reactor $L_{FO}$ (not illustrated) connected in series therewith.

The DC output from the multiphase rectifier 60 is outputted via the wiring inductance $L_O$ provided in the wiring 90, and supplied to the plasma generator 4 via the output cable 3 which establishes connection between the direct current power supply device 1 and the plasma generator 4.

The direct current power supply device 1 of the present invention may be configured in such a manner that parasitic impedance is used in the multiphase rectifier 60, instead of the DC filter circuit, so as to remove the high-frequency ripple component. By way of example, it is possible to use as an inductance component, the inductance $L_O$ of the wiring 90 between the multiphase rectifier 60 and the output terminal, and use as a capacitive component, the capacitive component of the output cable 3 connected between the direct current power supply device 1 and the load, or the output capacitance $C_0$ of the plasma generator 4 in the case of plasma load. The aforementioned parasitic impedance of the multiphase inverter, and capacitive components of the output cable and of the electrode capacitance substantially constitute the DC filter circuit, thereby reducing the high-frequency ripple component included in the AC output from the multiphase inverter.

In the configuration which utilizes wiring impedance or the parasitic impedance of the electrode capacitance in the output cable or in the plasma generator, instead of the DC filter circuit, as far as the capacitive component corresponding to the output capacitor $C_{FO}$ has magnitude being sufficient for supplying arc energy $P_c$, it is possible to remove the high-frequency ripple component, as well as supplying the arc energy $P_c$.

In addition, the high-frequency ripple component possesses a property to increase, when the drive frequency of the multiphase inverter circuit is decreased. Therefore, by increasing the drive frequency of the multiphase inverter circuit, it is possible to reduce the necessity of the output capacitor $C_{FO}$ and the output reactor (inductance) $L_{FO}$. Furthermore, increase of the drive frequency of the multiphase inverter circuit may allow suppression of the energy which is held inside the direct current power supply device 1.

The direct current power supply device 1 of the present invention is further provided with a chopper controller 70 for controlling the current source step-down type chopper 30, and an inverter controller 80 for controlling the multiphase inverter 40.

The chopper controller 70 is a circuit for performing chopper control on the switching element $Q_1$ in the current source step-down type chopper 30, and the chopper controller 70 detects chopper current being the output current of the switching element $Q_1$ and the output voltage from the direct current power supply device 1, and controls the output from the current source step-down type chopper 30 to become a predetermined current value and a predetermined voltage value, based on detection values of the chopper current and the output voltage.

The inverter controller 80 controls the switching operations of the switching elements connected respectively to the arms constituting the bridge circuit of the multiphase inverter 40. The multiphase inverter 40 controls the switching elements to subject the inputted DC to DC-AC conversion so as to obtain AC.

Figure 7:
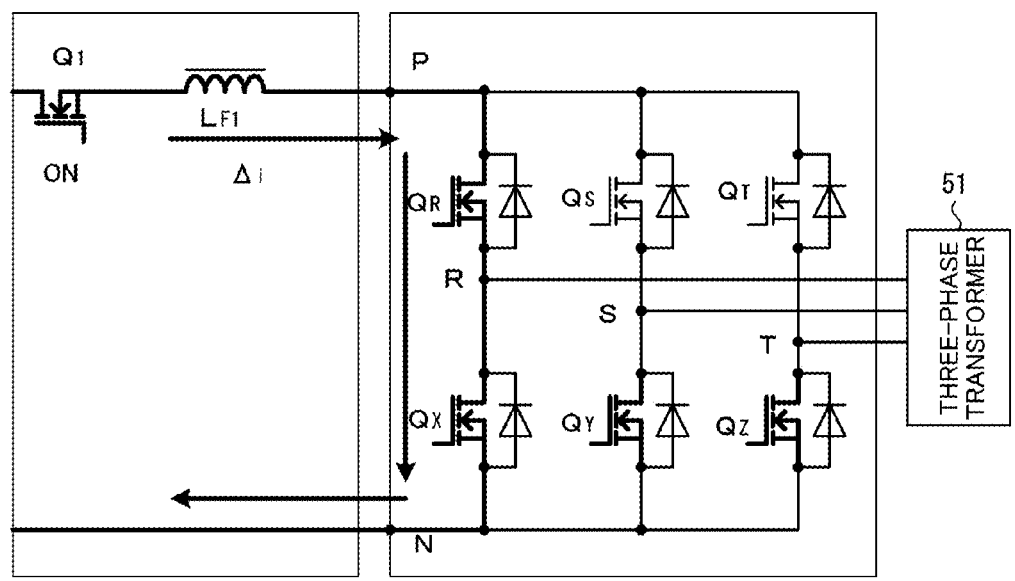
FIG. 7 illustrates a circuit state upon ignition of the direct current power supply device according to the present invention.

The multiphase inverter 40 is made up of the bridge circuit having six arms as shown in FIG. 7, for instance, if it is a three-phase inverter. Those arms are respectively provided with six switching elements $Q_R$, $Q_S$, $Q_T$, $Q_X$, $Q_Y$, and $Q_Z$. The switching element $Q_R$ and the switching element $Q_X$ are connected in series, the switching element $Q_S$ and the switching element $Q_Y$ are connected in series, and the switching element $Q_T$ and the switching element $Q_Z$ are connected in series.

The connection point R between the switching element $Q_R$ and the switching element $Q_X$ is connected as an R-phase component of the three phase transformer 51, the connection point S between the switching element $Q_S$ and the switching element $Q_Y$ is connected as an S-phase component of the three phase transformer 51, and the connection point T between the switching element $Q_T$ and the switching element $Q_Z$ is connected as a T-phase component of the three phase transformer 51.

As the control of the multiphase inverter, PWM control is known, which is able to change the magnitude of output current under a certain input current. The PWM control compares a carrier wave with a modulation wave, thereby forming a pulse control signal as to each phase. In the case of the three-phase inverter, the pulse control signal of each phase has on-period of 120°. This pulse control signal performs ON/OFF control of the switching elements of respective arms of the inverter, thereby forming R-phase current, S-phase current, and T-phase current, having 120° phase difference therebetween.

The chopper controller 70 and the inverter controller 80 receive feedback signals from the output terminal of the direct current power supply device 1 or the load side. The feedback signal may be voltage and current of the output terminal of the direct current power supply device 1, for instance.

Next, with reference to FIG. 3, one configuration example of the chopper controller 70 will be explained. The chopper controller 70 performs pulse width control on the switching element in the current source step-down type chopper 30, so as to perform constant voltage control in a ignition mode, or to perform any control selected from constant voltage control, constant current control, and constant power control, in a steady operation mode. Control is performed by switching between a set value of the ignition mode and a set value of the steady operation mode, the set values being different from each other. In the ignition mode, the set value corresponds to the ignition set voltage $V_{IGR}$, and in the steady operation mode, the set value corresponds to the steady operation set voltage $V_R$ in the constant voltage control, the set value corresponds to the steady operation set current $I_R$ in the constant current control, and the set value corresponds to the steady operation set power $P_R$ in the constant power control.

It is possible to perform switching from the ignition set voltage $V_{IGR}$ to any of the set values (the steady operation set voltage $V_R$ in the constant voltage control, the steady operation set current $I_R$ in the constant current control, the steady operation set power $P_R$ in the constant power control) in the respective control in the steady operation mode, by detecting that the output voltage and the output current have reached predetermined values. For example, in order to perform switching between the set values by detecting the output voltage and the output current, a time point is detected when the output current reaches the ignition set current after increasing thereof in the ignition mode, the ignition set current being set in association with starting of the plasma discharge, and the output voltage drops to the plasma generation voltage. Then, at this detection point, switching of the set values is performed. FIG. 3 is a configuration for switching the ignition set voltage $V_{IGR}$ to a set value (the steady operation set voltage $V_R$, the steady operation set current $I_R$, or the steady operation set power $P_R$) of the selected control, based on the detection of the output voltage $V_o$ and the output current $I_o$.

The chopper controller 70 is provided with a comparator circuit 70e being a configuration for switching the set values based on the output current and the output voltage, in which the output current $I_o$ is compared with the ignition set current $I_{IGR}$ and the output voltage $V_o$ is compared with the plasma generation set voltage $V_{PLR}$. A switching signal is outputted when the output current $I_o$ becomes equal to or higher than the ignition set current $I_{IGR}$, and the output voltage $V_o$ becomes equal to or lower than the plasma generation set voltage $V_{PLR}$. It is possible to store the ignition set current $I_{IGR}$ in the memory means 70f, and store the plasma generation set voltage $V_{PLR}$ in the memory means 70g.

Instead of the plasma generation set voltage $V_{PLR}$, the ignition set voltage $V_{IGR}$ and a constant k are stored, and the plasma generation set voltage $V_{PLR}$ may be set by multiplying the ignition set voltage $V_{IGR}$ by the constant k. It is further possible to set the constant k to any value, within the range from 0.2 to 0.9, for instance.

The chopper controller 70 is provided with a switching circuit 70b which performs switching of the set values for the control in the pulse width control on the switching element $Q_1$, from the ignition set voltage $V_{IGR}$ performing the constant voltage control in the ignition mode, to a set value of the control selected in the steady operation mode (the steady operation set voltage $V_R$ in the constant voltage control, the steady operation set current $I_R$ in the constant current control, and the steady operation set power $P_R$ in the constant voltage control).

The switching circuit 70b outputs any of the ignition set voltage $V_{IGR}$, the steady operation set voltage $V_R$, the steady operation set current $I_R$, and the steady operation set power $P_R$, based on the switching signal outputted from the comparator circuit 70e. It is possible to store the ignition set voltage $V_{IGR}$ in the memory means 70c, and the steady operation set values such as the steady operation set voltage $V_R$, the steady operation set current $I_R$, and the steady operation set power $P_R$ may be stored in the memory means 70d. Each of the memory means 70c to 70g may not be limited to the configuration provided within the chopper controller 70. By way of example, they may be configured as provided in an optional constitutional element such as a controller for controlling the entire direct current power supply device, or alternatively, it may be inputted from the outside of the direct current power supply device.

The chopper controller 70 is provided with a switching element control signal generation circuit 70a for generating a switching element control signal to perform any of the control; the constant voltage control, the constant current control, and the constant power control, by the pulse width control, so that the output becomes a set value. The switching element control signal generation circuit 70a generates the switching element control signal, assuming as the set value, any of the ignition set voltage $V_{IGR}$, the steady operation set voltage $V_R$, the steady operation set current $I_R$, the steady operation set power $P_R$ transferred from the switching circuit 70b to perform chopper control on the switching element $Q_1$ in the current source step-down type chopper 30.

Next, with reference to FIG. 4, one configuration example of the inverter controller 80 will be explained. The inverter controller 80 controls ON/OFF operation of the switching element in the multiphase inverter 40, and performs DC-AC conversion from DC to AC, and generates the short-circuit current for the current source step-down type chopper.

The control of the DC-AC conversion from DC to AC is performed according to a gate pulse signal G, and the intermittent short-circuit control is performed according to the short-circuit pulse signal $P_i$. The gate pulse signal G is generated in any of the following modes; the ignition mode and the steady operation mode. On the other hand, generation of the short-circuit pulse signal $P_i$ starts upon rising of the ignition signal IG and the generation thereof stops according to the switching signal being an output from the comparator circuit 70e of the chopper controller 70.

The inverter controller 80 is provided with a gate pulse signal generation circuit 80c for generating the gate pulse signal G, a short-circuit pulse signal generation circuit 80d for generating the short-circuit pulse signal $P_i$, an adder circuit 80b for adding the gate pulse signal G to the short-circuit signal $P_i$ to generate a control signal, and a control signal output part 80a for outputting the control signal to the multiphase inverter 40.

The multiphase inverter 40 performs the DC-AC conversion according to the gate pulse signal G within the control signal, establishes a short circuit between the positive voltage side and the negative voltage side according to the short-circuit pulse signal $P_i$ within the control signal, thereby allowing short-circuit current to flow in the current source step-down type chopper 30.

[Operation Example of the Direct Current Power Supply Device]

Next, operation examples of the ignition mode and the steady operation mode in the direct current power supply device according to the present invention will be explained, with reference to the flowchart in FIG. 5, the timing chart in FIG. 6, a circuit state upon ignition in FIG. 7, and an operation state diagram illustrating the ignition mode and the steady operation mode in FIG. 8. It is to be noted that in the following explanation, the constant voltage control is selected as the steady operation mode, and the steady operation set voltage $V_R$ is assumed as the set value.

When the direct current power supply device supplies DC power to the plasma generator, and plasma processing is performed in the plasma generator, plasma discharge is generated by the ignition mode S1 upon power activation or upon restarting, and after the plasma discharge occurs, the plasma discharge is maintained by the steady operation mode S2.

Figure 5:
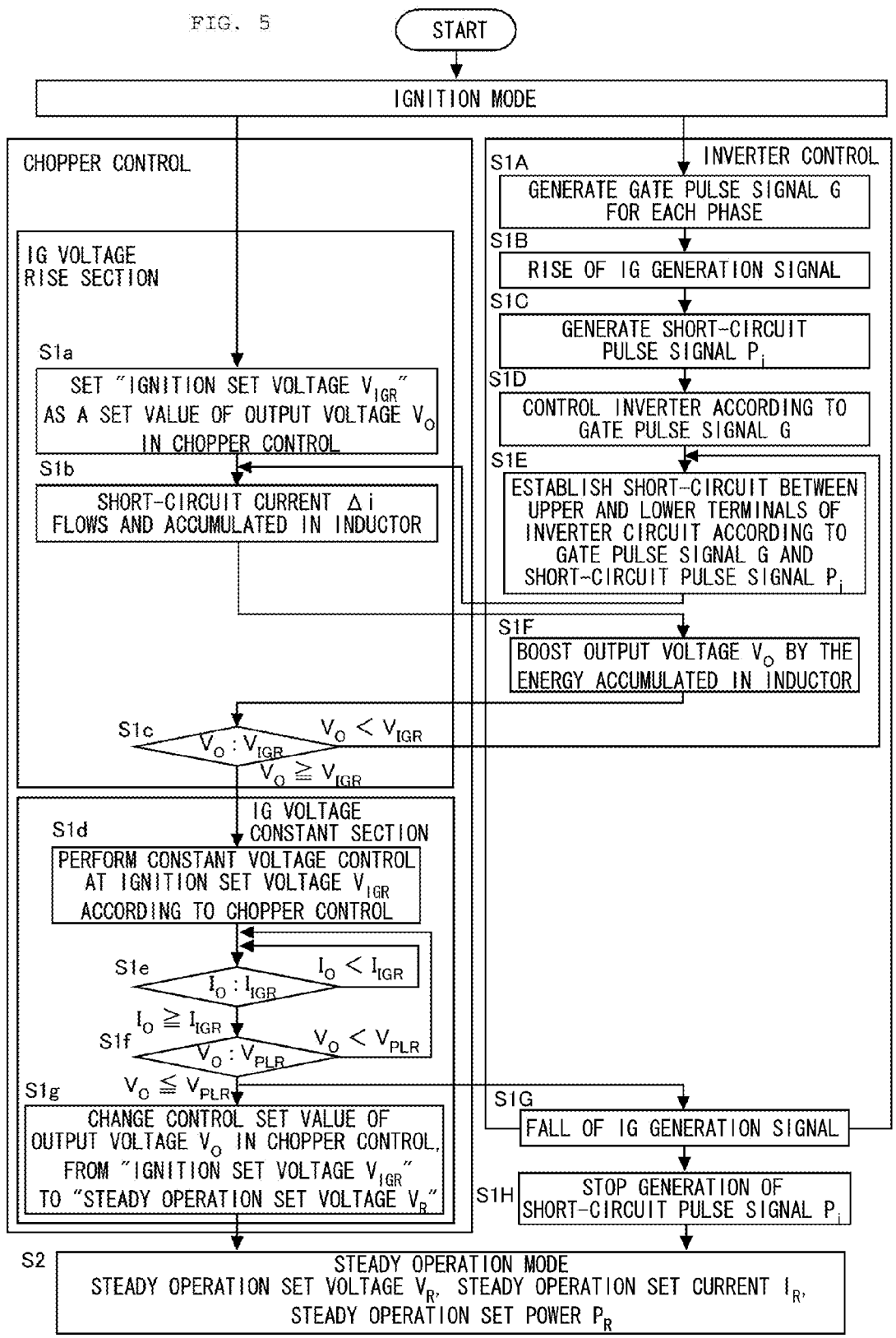
FIG. 5 is a flow chart for explaining an operation example of the ignition mode and the steady operation mode of the direct current power supply device according to the present invention.

With reference to FIG. 5, an explanation will be made as to an example in which the inverter control establishes a short circuit between the positive voltage side and the negative voltage side of the multiphase inverter, and this short-circuit operation allows the short-circuit current to flow in the current source step-down type chopper.

Firstly, the ignition mode S1 will be explained. The chopper controller perform control in the ignition mode, by two sections; control during IG voltage rise section (S1a to S1c) for boosting the output voltage to the ignition set voltage, and control during IG voltage constant section (S1d to S1f) for maintaining the boosted output voltage at the ignition set voltage. On the other hand, the inverter controller performs the inverter control according to the gate pulse signal G, and the intermittent short-circuit control according to the short-circuit pulse signal $P_i$, during the ignition mode S1.

(Control in the IG Voltage Rise Section)

In the IG voltage rise section, it is controlled to boost the output voltage up to the ignition set voltage. In the inverter control, the gate pulse signal G is generated for drive control of the switching element for each phase in the bridge circuit provided in the multiphase inverter (S1A), and an ignition (IG) generation signal is made to rise, the signal defining the ignition mode section (S1B). Along with the rise of the ignition (IG) generation signal, the short-circuit pulse signal $P_i$ is generated (S1C).

FIG. 6A illustrates the ignition (IG) generation signal, FIG. 6B illustrates the gate pulse signal G, and FIG. 6C illustrates the short-circuit pulse signal $P_i$. It is to be noted that FIG. 6B illustrates the state where the short-circuit pulse signal $P_i$ is superimposed on the gate pulse signal G.

The gate pulse signal G generated in the S1A controls the multiphase inverter (S1D), the ignition (IG) generation signal generated in the SIC establishes the short-circuit between the positive voltage side and the negative voltage side (upper and lower terminals of the bridge circuit) (S1E).

The short-circuit pulse signal $P_i$ is generated only for an extremely short duration $T_{ion}$, which turns the switching elements constituting the bridge circuit of the inverter circuit to ON state, together with the gate pulse signal G, thereby establishing a short-circuit between the positive voltage side and the negative voltage side. By way of example, the gate pulse signal $G_R$ and the short-circuit pulse signal $P_i$ superimposed on the gate pulse signal $G_X$ turn the switching element $Q_R$ and the switching element $Q_X$ in the bridge circuit to ON state, thereby establishing the short-circuit between the upper and lower terminals of the bridge circuit.

On the other hand, the chopper controller sets the ignition set voltage $V_{IGR}$ as a voltage set value for performing constant voltage control on the output voltage $V_o$, following the rise of the ignition (IG) generation signal (S1a).

FIG. 6D illustrates the output voltage $V_o$ and the output current $I_o$. With respect to the output voltage $V_o$, the ignition set voltage $V_{IGR}$ represents the voltage set value of the output voltage $V_o$ in the constant voltage control of the ignition mode, and the steady operation set voltage $V_R$ represents the voltage set value of the output voltage $V_o$ in the constant voltage control of the steady operation. In addition, with respect to the output current $I_o$, the ignition set current $I_{IGR}$ represents a current set value of the output current $I_o$ in the ignition mode.

The step of the short-circuit operation of S1E allows the short-circuit current $\Delta i$ to flow in the current source step-down type chopper. This short-circuit current $\Delta i$ is accumulated in the inductor provided in the current source step-down type chopper (S1b).

A fall of the short-circuit pulse signal $P_i$ stops the short-circuit operation, and the energy accumulated in the inductor boosts the output voltage $V_o$ (S1F).

The output voltage $V_o$ is compared with the ignition set voltage $V_{IGR}$, and if the output voltage $V_o$ has not reached the ignition set voltage $V_{IGR}$, the processes (S1E to S1F) is performed; i.e., a next short-circuit pulse signal $P_i$ establishes a short-circuit between the positive voltage side and the negative voltage side (upper and lower terminals of the bridge circuit) of the multiphase inverter, so as to boost the output voltage $V_o$ according to the short-circuit current $\Delta i$. Then, the voltage boosting step according to the short-circuit operations S1E to S1F is repeated until the output voltage $V_o$ reaches the ignition set voltage $V_{IGR}$.

Intermittent short-circuit operation according to the repetition of the S1E and S1F boosts the output voltage $V_o$ step by step. With regard to the output voltage $V_o$ as shown in FIG. 6, a portion indicated by the symbol A represents the step-by-step boosting state up to the ignition set voltage $V_{IGR}$.

Hereinafter, the voltage boosting operation according to the short-circuit current will be explained. FIG. 7 indicates the short-circuit state upon ignition. FIG. 7 illustrates an example where the switching element $Q_R$ and the switching element $Q_X$ are turned to be ON state simultaneously in the bridge circuit of the three-phase inverter, thereby establishing a short-circuit between the positive voltage side and the negative voltage side (upper and lower terminals of the bridge circuit).

While the switching element $Q_R$ is in the ON state by the gate pulse signal $G_R$, the short-circuit pulse signal $P_i$ turns the switching element $Q_X$ to ON state at any point of time during this ON state of the switching element $Q_R$. This process establishes a short circuit between P and N (the upper and lower terminals of the bridge circuit) respectively on the positive voltage side and on the negative voltage side, via the switching element $Q_R$ and the switching element $Q_X$.

As shown in FIG. 7, this short circuiting allows the short-circuit current Δi to flow in the current source step-down type chopper. The short-circuit current Δi flows only for an extremely short duration $T_{ion(n)}$ corresponding to the signal width of the short-circuit pulse signal $P_i$. The short-circuit current Δi is reset for each short-circuit operation.

Energy $J_{i(n)}$ according to the short-circuit current Δi is accumulated in the DC reactor $L_{F1}$ of the current source step-down type chopper. When the input voltage to the DC reactor $L_{F1}$ is assumed as $V_{in}$, the short-circuit current $\Delta i_1$ for one time of the extremely short duration $T_{ion(n)}$, and the energy $J_{i(n)}$ according to the short-circuit current $\Delta i_1$ are expressed by the following formulas:

$$\Delta i_1 = (V_{in}/L_{F1}) \times T_{ion(n)} \tag{1}$$

$$J_{i(n)} = (1/2) \times L_{F1} \times \Delta i_1^2 \tag{2}$$

The energy $J_{i(n)}$ accumulated in the DC reactor $L_{F1}$ according to the short-circuit operation of $T_{ion(n)}$, during the period from the end of the n-th short-circuit operation $T_{ion(n)}$, to the start of the next (n+1) short-circuit operation $T_{ion(n+1)}$, is supplied to the load, via the inverter, the transformer, and the rectifier.

Here, the capacitive component on the output side of the direct current power supply device is assumed as $C_{OT}$, and the output voltage upon ignition is assumed as $V_{o(n)}$, the energy $J_{i(n)}$ transferred to the output side capacitive component $C_{OT}$ according to the short-circuit operation is expressed by the following formula (3). Here, it is possible to assume the output side capacitive component $C_{OT}$ as the output capacitance $C_{FO}$ and the electrode capacitance $C_o$ of the plasma generator being the load:

$$\begin{aligned} J_{i(n)} &= (1/2) \times L_{F1} \times \Delta i_1^2 \\ &= (1/2) \times C_{OT} \times (V_{o(n)}^2 - V_{o(n-1)}^2) \end{aligned} \tag{3}$$

It is to be noted here that the output voltage before performing the initial short-circuit operation is assumed as $V_{o(0)} = 0$.

According to the formula (3), the output voltage $V_{o(n)}$ upon ignition is expressed by the following formula (4):

$$V_{o(n)} = \{(L_{F1}/C_{OT}) \times \Delta i_1^2 \times V_{o(n-1)}^2\}^{1/2} \tag{4}$$

The formula (4) represents the output voltage $V_{o(n)}$ when the short-circuit operation is repeated for n times.

When the short-circuit operation is performed three times (n=3), the output voltage upon each short-circuit operation is expressed by the following formulas:

$$V_{o(1)} = \{(L_{F1}/C_{OT}) \times \Delta i_1^2\}^{1/2} \tag{5}$$

$$V_{o(2)} = \{(L_{F1}/C_{OT}) \times \Delta i_1^2 + V_{o(1)}^2\}^{1/2} \tag{6}$$

$$V_{o(3)} = \{(L_{F1}/C_{OT}) \times \Delta i_1^2 + V_{o(2)}^2\}^{1/2} \tag{7}$$

The formula (4) indicates that the output voltage $V_{o(n)}$ upon ignition is able to be selectively determined, according to the number of the short-circuit operation times n.

In addition, the short-circuit current $\Delta i_1$ is proportional to the input voltage $V_{in}$ as indicated by the formula (1). The input voltage $V_{in}$ corresponds to the output voltage from the current source step-down type chopper, and the output voltage is determined by the ON duty ratio of the switching element $Q_1$ of the current source step-down type chopper.

Therefore, the boosting ratio of the output voltage $V_{o(n)}$ is determined by the number of the short-circuit operation times n, and the ON duty ratio of the switching element $Q_1$ in the current source step-down type chopper.

It is to be noted that the short-circuit operation is performed n times during the ignition mode. Therefore, in the case where the short-circuit pulse signal is outputted in sync with the gate pulse signal, the number of times above is automatically determined by the time period from the point of starting the ignition mode to the point of canceling the ignition mode, and the duration of the gate pulse signal.

(Control in the IG Voltage Constant Section)

In the IG voltage constant section, the boosted output voltage is controlled to be maintained at the ignition set voltage.

When the output voltage $V_o$ reaches the ignition set voltage $V_{IGR}$ (S1c), the control is switched from the control in the IG voltage boosting section (S1a to S1c) to the control in the IG voltage constant section (S1d to S1f), and the boosted output voltage is maintained at the ignition set voltage, in the ignition mode of the chopper control. With regard to the output voltage $V_o$ as shown in FIG. 6, a portion indicated by symbol B represents the constant voltage state being maintained at the ignition set voltage $V_{IGR}$.

In the control in the IG voltage constant section, the constant voltage control is performed in the chopper control at the ignition set voltage (S1d). The output current $I_o$ is raised both in the IG voltage boosting section and in the IG voltage constant section. With regard to the output current $I_o$ as shown in FIG. 6, the portion indicated by the symbol D represents the current rising state in the IG voltage boosting section and in the IG voltage constant section.

When a plasma discharge occurs in the plasma generator, the ignition set current $I_{IGR}$ flows as the output current $I_o$, and after transferred to the steady operation state, the output current $I_o$ of the steady operation is allowed to flow. With regard to the output current $I_o$ as shown in FIG. 6, the output current $I_o$ higher than the ignition set current $I_{IGR}$ flows at the portion indicated by the symbol E, which represents a transferring state to the output current $I_o$ of the steady operation, and the portion indicated by the symbol F represents the output current $I_o$ of the steady operation.

Therefore, when the output voltage $V_o$ reaches the steady operation set voltage $V_R$, and the ignition set current $I_{IGR}$ flows as the output current $I_o$, it is determined that the plasma discharge has occurred.

If it is determined whether or not the plasma discharge has occurred in the plasma generator, by checking whether the output voltage $V_o$ and the output current $I_o$ reach the predetermined voltage and the predetermined current, respectively, the output current which flows upon the plasma discharge occurrence is predetermined as the ignition set current $I_{IGR}$ and the output voltage is predetermined as the ignition set voltage $V_{IGR}$. Then, the output current $I_o$ and the ignition set current $I_{IGR}$ being preset are compared, and the output voltage $V_o$ is compared with the plasma generation set voltage $V_{PLR}$ which is obtained by multiplying the ignition set voltage $V_{IGR}$ being preset, by the constant k. The constant k is set to be a value in the range from 0.2 to 0.9, for instance (S1e, S1f).

When the output current $I_o$ reaches the ignition set current $I_{IGR}$ (S1e), and the output voltage $V_o$ drops lower than the plasma generation set voltage $V_{PLR}$ obtained by multiplying the ignition set voltage $V_{IGR}$ by the constant k (S1f), the chopper controller changes a set value of the output voltage $V_o$ of the constant voltage control from the ignition set voltage $V_{IGR}$ to the steady operation set voltage $V_R$ (S1g), and the inverter controller allows the ignition (IG) generation signal to fall (S1G) and stops generation of the short-circuit pulse signal $P_i$ (S1H).

The chopper controller switches the set voltage of the constant voltage control from the ignition set voltage $V_{IGR}$ to the steady operation set voltage $V_R$, and simultaneously, the inverter controller stops the IG generation signal so as to stop generation of the short-circuit pulse signal $P_i$, thereby terminating the ignition mode and it is switched to the steady operation mode. With regard to the output voltage $V_o$ as shown in FIG. 6, the portion indicated by the symbol C represents the constant voltage state which is maintained at the steady operation set voltage $V_R$.

The IG voltage constant section is terminated by stopping the short-circuit pulse signal $P_i$.

In the example described above, when the output voltage being boosted reaches the ignition set voltage, the constant voltage control is performed at the ignition set voltage by the pulse width control on the switching element $Q_1$, thereby controlling the OFF state described above.

Next, in the steady operation mode S2, the plasma discharge generated in the ignition mode is maintained. In order to maintain the plasma discharge, the chopper controller performs the constant voltage control at the steady operation set voltage $V_R$, and the inverter controller performs normal pulse width control.

FIG. 8 illustrates operating conditions of the chopper control and the inverter control in the ignition mode and in the steady operation mode.

In the ignition mode, the chopper control allows the current source step-down type chopper to perform the constant voltage control on the output voltage $V_o$, so that it becomes the ignition set voltage by the pulse width control, and the inverter control performs the DC-AC conversion control according to the pulse width control.

The inverter control performs the intermittent short-circuit control in the IG voltage boosting section of the ignition mode, and performs boosting control on the ignition voltage up to the ignition set voltage $V_{IGR}$. It is to be noted that in addition to the boosting control performed by the intermittent short-circuit control according to the inverter control, the boosting control is also able to be performed by controlling the switching element for short circuiting provided in the current source step-down type chopper.

In the ignition mode, the output voltage boosts up to the ignition set voltage $V_{IGR}$ in the IG voltage boosting section, and after it reaches the ignition set voltage $V_{IGR}$, it is maintained at the ignition set voltage $V_{IGR}$ in the IG voltage constant section.

In addition, in the ignition mode, the output current is raised up to the ignition set current $I_{IGR}$.

The point of time when the output current reaches the ignition set current $I_{IGR}$, and the output voltage drops below the value ($k \cdot V_{IGR}$) obtained by multiplying the ignition set voltage $V_{IGR}$ by the constant k (k=0.2 to 0.9) is determined as the state where the plasma discharge occurs (plasma ignition), and it is switched from the ignition mode to the steady operation mode. Upon this switching from the ignition mode to the steady operation mode, the set voltage of the constant voltage control in the chopper control is switched from the ignition set voltage $V_{IGR}$ to the steady operation set voltage $V_R$.

In the steady operation mode, if any of the constant voltage control, the constant current control, and the constant power control is selected, the control is switched to the selected control after it is determined that the plasma discharge has occurred. On this occasion, after reaching the ignition set current $I_{IGR}$, the output current becomes the output current $I_o$ for the steady operation.

[Alternative Configuration Examples of the Direct Current Power Supply Device]

Next, alternative configuration examples of the direct current power supply device will be explained.

(Alternative Configuration Example 1 of the Direct Current Power Supply Device)

FIG. 9 is a timing chart for explaining the alternative configuration example 1 of the direct current power supply device. The short-circuit pulse signal $P_i$ of the configuration example 1 turns all the switching elements in the bridge circuit to ON state, simultaneously. All the switching elements in the bridge circuit are turned to ON state simultaneously by using this short-circuit pulse signal $P_i$, and therefore it is possible to perform the short-circuit operation, regardless of ON state or OFF state of the switching elements in the bridge circuit.

Figure 6:
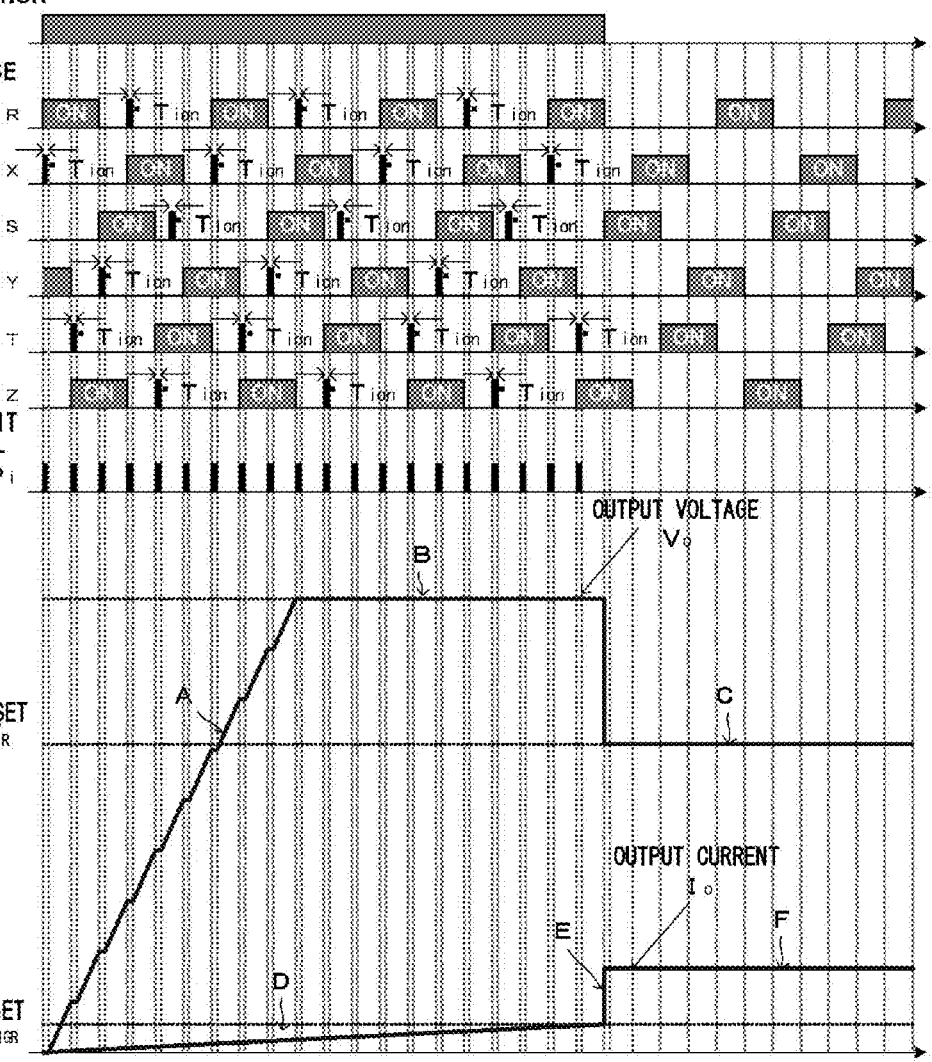
FIG. 6 is a timing chart for explaining the operation example of the ignition mode and the steady operation mode of the direct current power supply device according to the present invention.

The timing chart as shown in FIG. 9 is similar to the timing chart as shown in FIG. 6, except the short-circuit pulse signal. FIG. 9B shows the short-circuit pulse signal $P_i$ and the gate pulse signal G in superimposing manner one on another, and the short-circuit pulse signal $P_i$ is shaded in black. The short-circuit pulse signal $P_i$ turns each of the switching elements $Q_R$, $Q_S$, $Q_T$, $Q_X$, $Q_Y$, and $Q_Z$ in the bridge circuit, simultaneously to ON state or OFF state. Even when the short-circuit pulse signal $P_i$ and the gate pulse signal G are superimposed one on another, it is possible to turn the switching element to ON state anyway, and therefore, the short-circuit state is allowed to be maintained regardless of the state of the gate pulse signal G.

(Alternative Configuration Example 2 of the Direct Current Power Supply Device)

FIG. 10 is a timing chart for explaining the alternative configuration example 2 of the direct current power supply device. The short-circuit pulse signal $P_i$ of the configuration example 2 turns at least one pair of the switching elements to ON state simultaneously, among the pairs of the switching elements provided in the bridge circuit, the pair being counterparts of each other by serially connected between the terminals on the positive voltage side and on the negative voltage side in the bridge circuit.

By turning at least one pair of the switching elements to ON state, simultaneously, on the upper and lower terminals of the bridge circuit, using this short-circuit pulse signal $P_i$, it is possible to perform short-circuit operation regardless of the ON state or OFF state of the switching elements in the bridge circuit.

The timing chart as shown in FIG. 10 is similar to the timing chart as shown in FIG. 6, except the short-circuit pulse signal. FIG. 10B shows the short-circuit pulse signal $P_i$ and the gate pulse signal G in superimposing manner one on another, and the short-circuit pulse signal $P_i$ is shaded in black. The short-circuit pulse signal $P_i$ turns the switching elements $Q_R$ and $Q_X$ in the bridge circuit, simultaneously to ON state or OFF state. Even when the short-circuit pulse signal $P_i$ and the gate pulse signal G are superimposed one on another, it is possible to turn the switching element to ON state, thereby allowing the short-circuit state to be maintained regardless of the state of the gate pulse signal G.

(Alternative Configuration Example 3 of the Direct Current Power Supply Device)

In the configuration example 3, a pulse signal is generated as a short-circuit pulse signal, which turns the switching element to ON state being the counterpart of the switching element operating in ON state by the gate pulse signal, among the pairs of the switching elements serially connected between the terminals on the positive voltage side and on the negative voltage side in the bridge circuit, at any point of time within the duration of the gate pulse signal which turns each switching element to ON state. Then, the switching elements being in pair are simultaneously operated in ON state, thereby allowing the short-circuit operation.

The aforementioned examples perform the short-circuit operation, by simultaneously turning the switching elements to ON state on the upper and lower terminals of the multiphase inverter. On the other hand, in the configuration example 4, a switching element $Q_2$ is connected with the output terminal of the current source step-down type chopper, or between the positive voltage side and the negative voltage side of the input terminal of the multiphase inverter, then allowing the switching element $Q_2$ to establish a short circuit. (Alternative Configuration Example 4 of the Direct Current Power Supply Device)

Figure 1A:
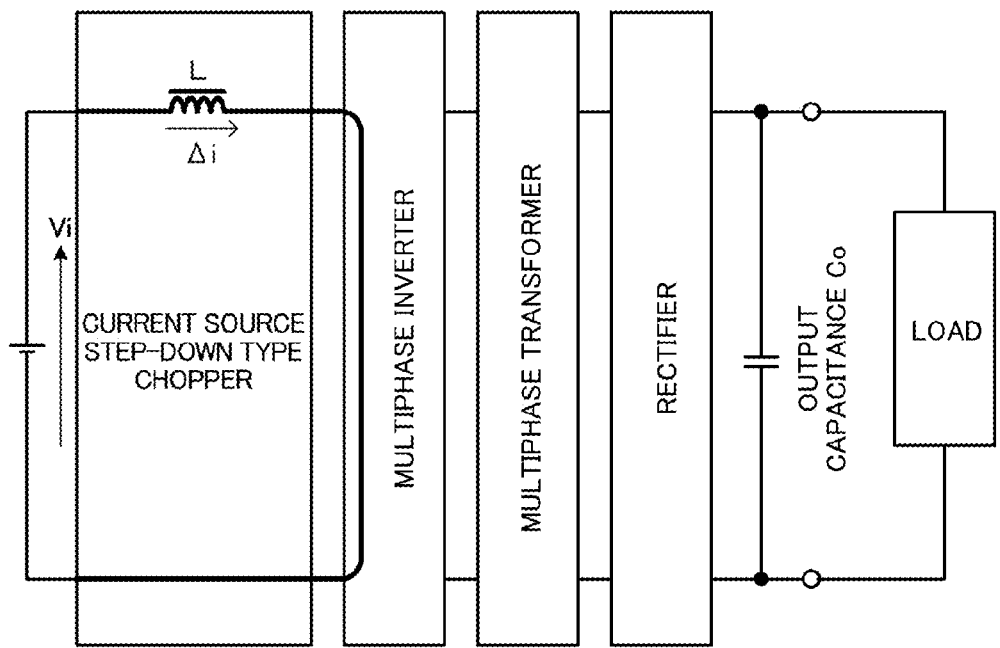
FIG. 1 illustrates an operation for generating short-circuit current and a boosting operation of the output voltage by the short-circuit current, according to the present invention.
Figure 1B:
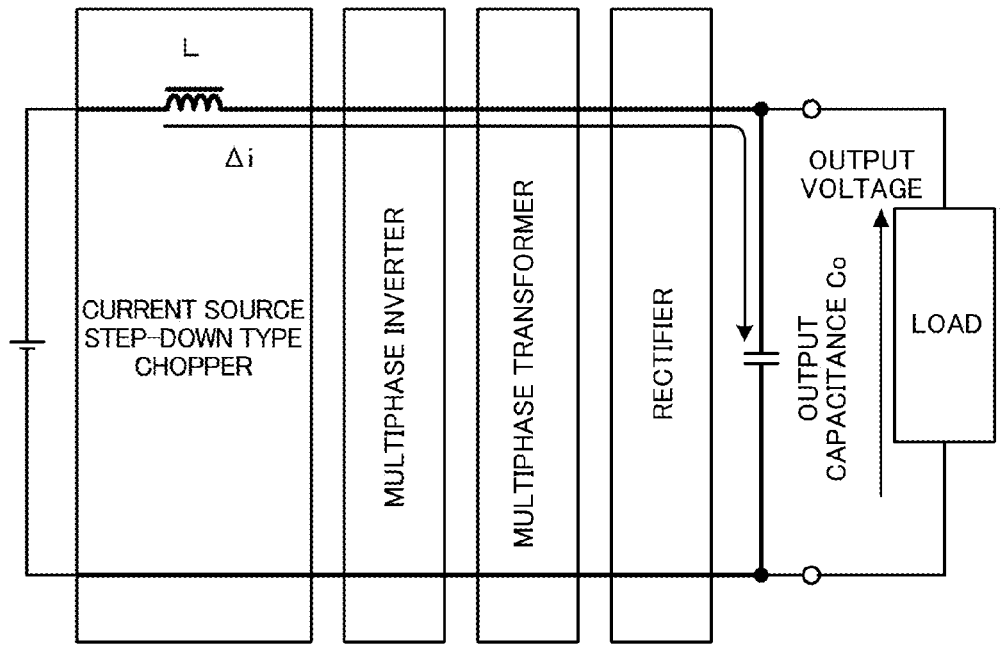
Figure 11:
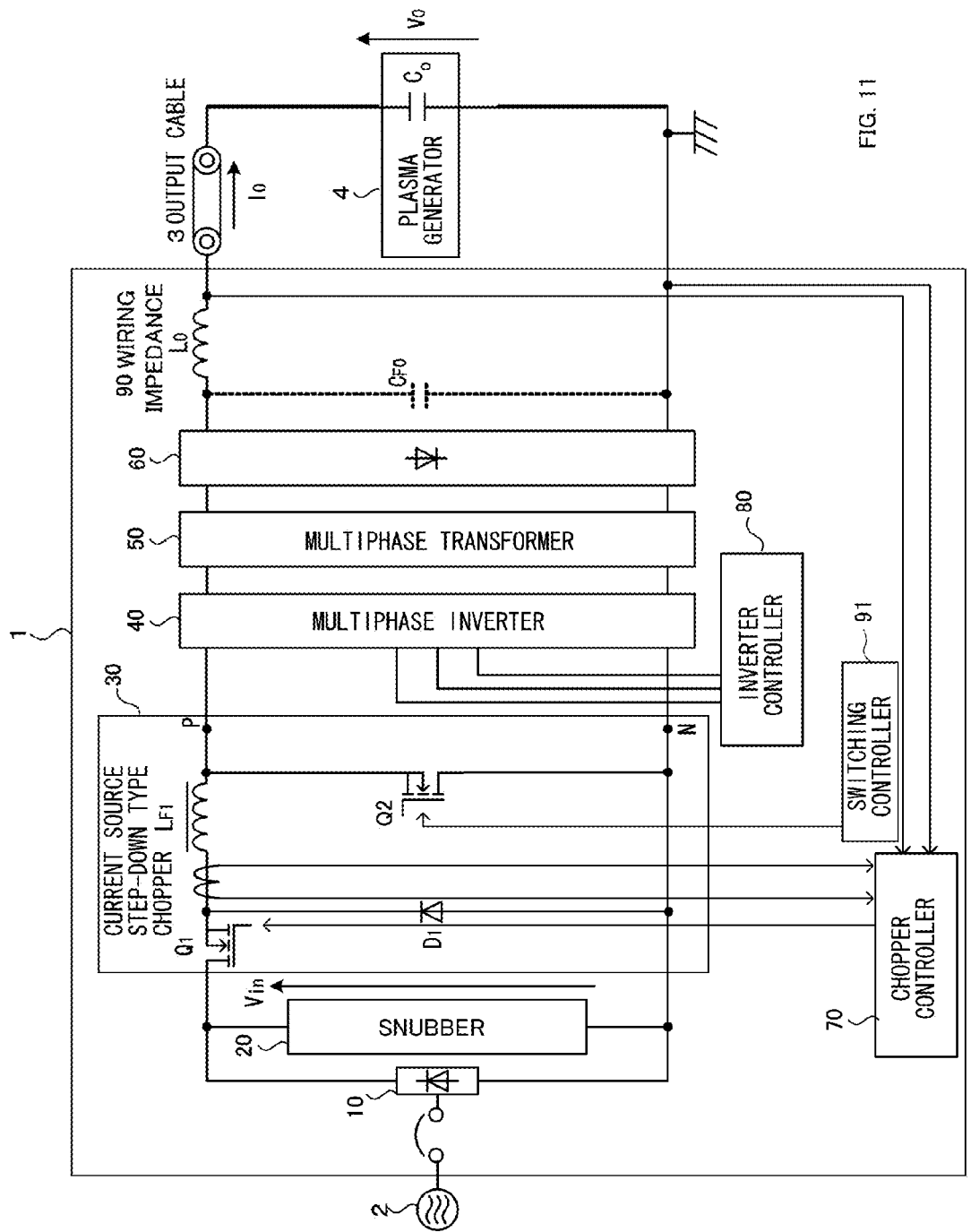
FIG. 11 is a block diagram for explaining the alternative configuration example 3 of the direct current power supply device.
Figure 12A:
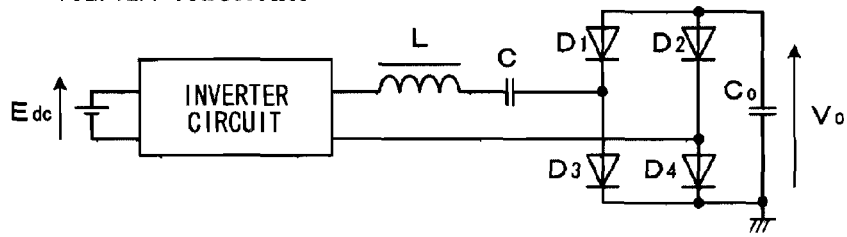
FIG. 12 illustrates a conventional circuit example to generate ignition voltage for the plasma discharge occurrence.
Figure 12B:
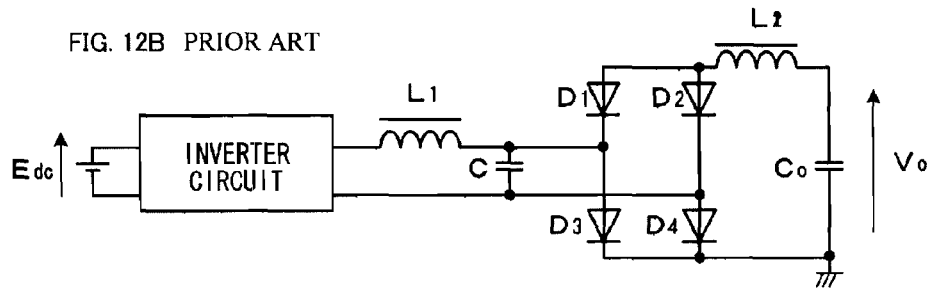
Figure 12C:
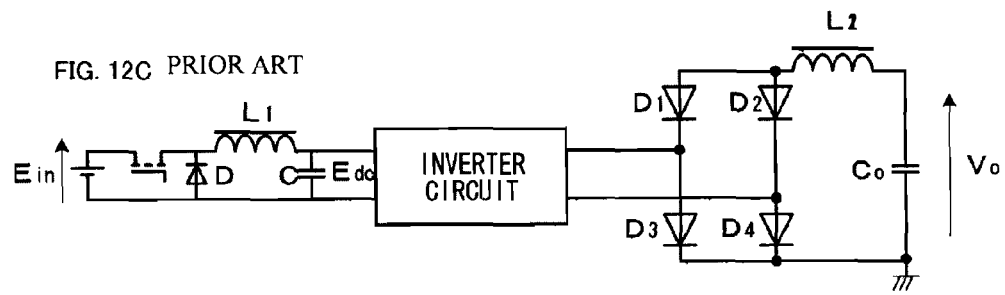

FIG. 11 is a block diagram for explaining the alternative configuration example 4 of the direct current power supply device. In the configuration example 4, the switching element $Q_2$ is connected between the positive voltage side and the negative voltage side on the output terminal of the current source step-down type chopper 30, and the switching controller 91 performs ON/OFF operation of the switching element $Q_2$, in the direct current power supply device as shown in FIG. 1.

With this configuration 4, it is possible to perform the short-circuit operation just by controlling one switching element $Q_2$, without controlling multiple switching elements provided in the bridge circuit in the multiphase inverter.

In the steady operation mode, any of the constant voltage control, the constant current control, and the constant power control is selectable as appropriate. For example, it is possible to select one control in advance and set the selected control in the switching circuit of the chopper controller, or it is settable from the outside of the direct current power supply device. It is further possible to configure such that the selection is changeable.

It is to be noted that the preferred embodiments and modifications described above are just examples of the direct current power supply device and the control method of the direct current power supply device relating to the present invention. It should be understood that the present invention is not limited to those embodiments but susceptible of changes and modifications without departing from the purpose of the invention, and all such modifications are intended to be included within the scope of the invention.

INDUSTRIAL APPLICABILITY

The current source inverter of the present invention is applicable as a power source for supplying power to a plasma generator, in order to perform film-forming process or etching process.

EXPLANATION OF REFERENCES

1 Direct current power supply device
2 AC source
3 Output cable
4 Plasma generator
10 Rectifier
20 Snubber
30 Current source step-down type chopper
40 Multiphase inverter
50 Multiphase transformer
51 Phase transformer
60 Multiphase rectifier
70 Chopper controller
70a Switching element control signal generation circuit
70b Switching circuit
70c Memory means (ignition set value)
70d Memory means (steady operation set voltage)
70e Comparator circuit
70f Memory means (ignition set current)
70g Memory means (plasma generation set voltage)
80 Inverter controller
80a Control signal output part
80b Adder circuit
80c Gate pulse signal generation circuit
80d Short-circuit pulse signal generation circuit
90 Wiring
91 Switching controller
92 Switching controller
$I_{IGR}$ Ignition set current
$I_o$ Output current
$I_R$ Steady operation set current
$P_R$ Steady operation set power
$V_{IGR}$ Ignition set voltage
$V_{in}$ Input voltage
$V_o$ Output voltage
$V_{PLR}$ Plasma generation set voltage
$V_R$ Steady operation set voltage
$\Delta i$ Short-circuit current

What is claimed is:

1. A direct current power supply device, comprising
a current source step-down type chopper forming a direct current source,
a multiphase inverter for converting a DC output from the current source step-down type chopper into multiphase AC power by operating multiple switching elements,
a rectifier for subjecting an output from the multiphase inverter to AC-DC conversion to supply direct current being obtained to a load, and
a controller having a chopper controller for controlling the current source step-down type chopper and an inverter controller for controlling the multiphase inverter,
the controller performing,
switching control, being controlled by the chopper controller, for switching between an ignition mode for supplying ignition voltage which generates plasma discharge in a plasma generator and a steady operation mode for maintaining the plasma discharge in the plasma generator, and
intermittent short-circuit control for establishing a short-circuit intermittently, between a positive voltage side and a negative voltage side of the current source step-down type chopper, or between the positive voltage side and the negative voltage side of the multiphase inverter, and
the controller further controlling in the ignition mode, a voltage boosting operation according to short-circuit current which is made to flow in the current source step-down type chopper by the intermittent short-circuit control, so as to control output voltage to be applied to the plasma generator.

2. The direct current power supply device, according to claim 1, wherein,
the controller allows the inverter controller to perform the intermittent short-circuit control,
in the intermittent short-circuit control, the inverter controller generates a gate pulse signal for performing pulse width control on switching elements in the bridge circuit constituting multiphase inverter, and a short-circuit pulse signal for establishing the short circuit intermittently between the positive voltage side and the negative voltage side of the bridge circuit, controls the multiphase inverter by a control signal which is obtained by superimposing the gate pulse signal and the short-circuit pulse signal one on another, turns a pair of the switching elements to ON state simultaneously by the short-circuit pulse signal, the pair being counterparts of each other serially connected between terminals on the positive voltage side and on the negative voltage side in the bridge circuit, thereby establishing the short-circuit between the terminals on the positive voltage side and on the negative voltage side of the bridge circuit.

3. The direct current power supply device, according to claim 2, wherein,
the inverter controller generates, at any point of time within a duration of the gate pulse signal for turning each of the switching elements to ON state, a pulse signal as the short-circuit pulse signal for starting ON operation of the switching element being the counterpart of the switching element that is operated in ON state by the gate pulse signal, among the pairs of the switching elements serially connected between the terminals on the positive voltage side and on the negative voltage side, and
establishes the short circuit between the positive voltage side and the negative voltage side of the bridge circuit, by the switching element being ON state according to the gate pulse signal and by the switching element being ON state according to the short-circuit pulse signal.

4. The direct current power supply device, according to claim 2, wherein,
the inverter controller generates a pulse signal as the short-circuit pulse signal which simultaneously starts ON operation of all the switching elements in the bridge circuit, and
the short-circuit pulse signal turns all the switching elements in the bridge circuit to ON state, thereby establishing a short-circuit between the positive voltage side and the negative voltage side of the bridge circuit.

5. The direct current power supply device, according to claim 2, wherein,
the inverter controller generates a pulse signal as the short-circuit pulse signal which simultaneously starts ON operation of at least one pair of the switching elements among the pairs of the switching elements being counterparts of each other serially connected between the terminals on the positive voltage side and on the negative voltage side of the bridge circuit, as to the switching elements provided in the bridge circuit, and
the short-circuit pulse signal turns at least one pair of the switching elements to ON state, being counterparts of each other serially connected between the terminals on the positive voltage side and on the negative voltage side in the bridge circuit, thereby establishing the short-circuit between the positive voltage side and the negative voltage side of the bridge circuit.

6. The direct current power supply device, according to claim 2, wherein,
in the ignition mode, the controller performs in a switching manner, voltage boosting control where the output voltage is raised up to the ignition set voltage by repeating multiple times the voltage boosting according to the short-circuit current, and constant voltage control where the chopper controller maintains the output voltage at the ignition set voltage, and
switches the voltage boosting control to the constant voltage control, after the output voltage reaches the ignition set voltage.

7. The direct current power supply device, according to claim 6, wherein,
the controller uses as parameters, an ON duty ratio of chopper control by the chopper controller, and the number of intermittent short-circuiting control times,
the ON duty ratio controls input voltage of the current source step-down type chopper,
the number of the intermittent short-circuiting control times controls a voltage boosting ratio, and
the input voltage and the voltage boosting ratio control a voltage rise of the output voltage.

8. The direct current power supply device, according to claim 1, comprising a switching element for short circuiting which establishes a short circuit between the positive voltage side and the negative voltage side, the switching element being placed between the current source step-down type chopper and the multiphase inverter, wherein,
the controller allows the chopper controller to perform the intermittent short-circuit control,
the chopper controller generates a short-circuit pulse signal for intermittently short circuiting the switching element for short circuiting, and
the short-circuit pulse signal turns the switching element for short circuiting to ON state, thereby establishing the short circuit between the positive voltage side and the negative voltage side of the output terminals of the current source step-down chopper.

9. The direct current power supply device, according to claim 8, wherein,
in the ignition mode, the controller performs in a switching manner, voltage boosting control where the output voltage is raised up to the ignition set voltage by repeating multiple times the voltage boosting according to the short-circuit current, and constant voltage control where the chopper controller maintains the output voltage at the ignition set voltage, and
switches the voltage boosting control to the constant voltage control, after the output voltage reaches the ignition set voltage.

10. The direct current power supply device, according to claim 9, wherein,
the controller uses as parameters, an ON duty ratio of chopper control by the chopper controller, and the number of intermittent short-circuiting control times,
the ON duty ratio controls input voltage of the current source step-down type chopper,
the number of the intermittent short-circuiting control times controls a voltage boosting ratio, and
the input voltage and the voltage boosting ratio control a voltage rise of the output voltage.

11. The direct current power supply device, according to claim 1, wherein,
in the ignition mode, the controller performs in a switching manner, voltage boosting control where the output voltage is raised up to the ignition set voltage by repeating multiple times the voltage boosting according to the short-circuit current, and constant voltage control where the chopper controller maintains the output voltage at the ignition set voltage, and
switches the voltage boosting control to the constant voltage control, after the output voltage reaches the ignition set voltage.

12. The direct current power supply device, according to claim 11, wherein,
the controller uses as parameters, an ON duty ratio of chopper control by the chopper controller, and the number of intermittent short-circuiting control times, the ON duty ratio controls input voltage of the current source step-down type chopper, the number of the intermittent short-circuiting control times controls a voltage boosting ratio, and the input voltage and the voltage boosting ratio control a voltage rise of the output voltage.

13. The direct current power supply device, according to claim 1, wherein, in the steady operation mode, any of following control is selectable;

constant voltage control for switching a set value for steady operation, from the ignition set voltage being set in the ignition mode, to steady operation set voltage, and maintaining the output voltage at the steady operation set voltage, constant current control for switching the set value for the steady operation, from the ignition set voltage being set in the ignition mode, to steady operation set current, and maintaining output current at the steady operation set current, and constant power control for switching the set value for the steady operation, from the ignition set voltage being set in the ignition mode, to steady operation set power, and maintaining output power at the steady operation set power, and the switching control of the controller switches the ignition mode to the steady operation mode, when the output current reaches the ignition set current and the output voltage drops to plasma generation voltage, and any of the control selected from the constant voltage control, the constant current control, and the constant power control is performed.

14. A method for controlling a direct current power supply device, the direct current power supply device comprising, a current source step-down type chopper forming a direct current source, a multiphase inverter for converting a DC output from the current source step-down type chopper into multiphase AC power by operating multiple switching elements, a rectifier for subjecting an output from the multiphase inverter to AC-DC conversion to supply direct current being obtained to a load, and a controller having a chopper controller for controlling the current source step-down type chopper, and an inverter controller for controlling the multiphase inverter, the method allowing the controller to perform, switching control for switching between ignition mode for supplying ignition voltage which generates plasma discharge in a plasma generator, and steady operation mode for maintaining the plasma discharge in the plasma generator, the switching control being controlled by the chopper controller, and intermittent short-circuiting control for establishing a short circuit intermittently, between the positive voltage side and the negative voltage side of the current source step-down type chopper or of the multiphase inverter, the method further allowing the controller to control in the ignition mode, a voltage boosting operation according to short-circuit current which is made to flow in the current source step-down type chopper by the intermittent short-circuit control, so as to control the output voltage to be applied to the plasma generator.

15. The method for controlling the direct current power supply device, according to claim 14, wherein, the controller allows the inverter controller to perform the intermittent short-circuit control, the inverter controller generates in the intermittent short-circuit control, a gate pulse signal for performing pulse width control on switching elements in a bridge circuit constituting a multiphase inverter, and a short-circuit pulse signal for establishing a short circuit intermittently between the positive voltage side and the negative voltage side of the bridge circuit, generates a control signal by superimposing the gate pulse signal and the short-circuit pulse signal one on another, and allows the control signal to control the multiphase inverter, so that the short-circuit signal turns a pair of the switching elements to ON state, simultaneously, the pair being counterparts of each other serially connected between the terminals on the positive voltage side and on the negative voltage side of the bridge circuit, thereby establishing the short circuit between the terminals on the positive voltage side and on the negative voltage side of the bridge circuit.

16. The method for controlling the direct current power supply device, according to claim 15, wherein, in the ignition mode, the controller performs in a switching manner, voltage boosting control for raising the output voltage up to the ignition set voltage, by repeating voltage boosting multiple times according to the short-circuit current, and constant voltage control where the chopper controller maintains the output voltage at the ignition set voltage, and after the output voltage reaches the ignition set voltage, the voltage boosting control is switched to the constant voltage control.

17. The method for controlling the direct current power supply device, according to claim 16, wherein, the controller uses as parameters, an ON duty ratio of chopper control by the chopper controller, and the number of intermittent short-circuiting control times, the ON duty ratio controls input voltage of the current source step-down type chopper, the number of the intermittent short-circuiting control times controls a voltage boosting ratio, and the input voltage and the voltage boosting ratio control a voltage rise of the output voltage.

18. The method for controlling the direct current power supply device, according to claim 14, wherein, in the ignition mode, the controller performs in a switching manner, voltage boosting control for raising the output voltage up to the ignition set voltage, by repeating voltage boosting multiple times according to the short-circuit current, and constant voltage control where the chopper controller maintains the output voltage at the ignition set voltage, and after the output voltage reaches the ignition set voltage, the voltage boosting control is switched to the constant voltage control.

19. The method for controlling the direct current power supply device, according to claim 18, wherein, the controller uses as parameters, an ON duty ratio of chopper control by the chopper controller, and the number of intermittent short-circuiting control times, the ON duty ratio controls input voltage of the current source step-down type chopper, the number of the intermittent short-circuiting control times controls a voltage boosting ratio, and the input voltage and the voltage boosting ratio control a voltage rise of the output voltage.

20. The method for controlling the direct current power supply device, according to claim 14, wherein, in the steady operation mode, any of following control is selectable;

constant voltage control for switching a set value for steady operation, from the ignition set voltage being set in the ignition mode, to steady operation set voltage, and maintaining the output voltage at the steady operation set voltage, constant current control for switching a set value for the steady operation, from the ignition set voltage being set in the ignition mode, to steady operation set current, and maintaining output current at the steady operation set current, and constant power control for switching a set value for the steady operation, from the ignition set voltage being set in the ignition mode, to steady operation set power, and maintaining output power at the steady operation set power, and the switching control of the controller switches the ignition mode to the steady operation mode, when the output current reaches the ignition set current and the output voltage drops to plasma generation voltage, and any of the control selected from the constant voltage control, the constant current control, and the constant power control is performed.

* * * * *